United States Patent
Yim et al.

(10) Patent No.: US 10,223,011 B2
(45) Date of Patent: Mar. 5, 2019

(54) STORAGE DEVICE INCLUDING NONVOLATILE MEMORY DEVICE AND CONTROLLER AND OPERATING METHOD OF THE STORAGE DEVICE

(71) Applicants: Hyejin Yim, Wonju-si (KR); Jinyub Lee, Seoul (KR); Kyung-Hwa Kang, Seoul (KR); Minseok Kim, Hwaseong-si (KR); Minsu Kim, Hwaseong-si (KR); Sung-Won Yun, Suwon-si (KR)

(72) Inventors: Hyejin Yim, Wonju-si (KR); Jinyub Lee, Seoul (KR); Kyung-Hwa Kang, Seoul (KR); Minseok Kim, Hwaseong-si (KR); Minsu Kim, Hwaseong-si (KR); Sung-Won Yun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/438,644

(22) Filed: Feb. 21, 2017

(65) Prior Publication Data
US 2017/0300252 A1 Oct. 19, 2017

(30) Foreign Application Priority Data
Apr. 14, 2016 (KR) .................. 10-2016-0045672

(51) Int. Cl.
| | | |
|---|---|---|
| G06F 11/10 | (2006.01) | |
| G06F 3/06 | (2006.01) | |
| G11C 29/52 | (2006.01) | |
| G11C 11/56 | (2006.01) | |
| G11C 16/26 | (2006.01) | |
| G11C 16/04 | (2006.01) | |

(52) U.S. Cl.
CPC .......... *G06F 3/0619* (2013.01); *G06F 3/0659* (2013.01); *G06F 3/0679* (2013.01); *G06F 11/1048* (2013.01); *G06F 11/1068* (2013.01); *G11C 11/5642* (2013.01); *G11C 16/26* (2013.01); *G11C 29/52* (2013.01); *G11C 16/0483* (2013.01)

(58) Field of Classification Search
CPC .................................................... G06F 11/1076
USPC ........................................ 714/764, 766, 763
See application file for complete search history.

(56) References Cited

U.S. PATENT DOCUMENTS

| 8,310,873 B2 | 11/2012 | Ueno et al. |
| 8,423,842 B2 | 4/2013 | Nakano et al. |
| 8,583,858 B2 | 11/2013 | Honda |

(Continued)

FOREIGN PATENT DOCUMENTS

| KR | 10-2012-0096212 A | 8/2012 |
| KR | 10-2013-0013574 A | 2/2013 |
| KR | 10-2013-0030099 A | 3/2013 |

*Primary Examiner* — Fritz Alphonse
(74) *Attorney, Agent, or Firm* — Volentine, Whitt & Francos, PLLC

(57) ABSTRACT

A storage device includes a nonvolatile memory device and a controller configured to generate a read command according to a request of an external host device and transmit the read command to the nonvolatile memory device. The nonvolatile memory device is configured to perform a read operation in response to the read command, to output read data to the controller, and to store information of the read operation in an internal register.

19 Claims, 15 Drawing Sheets

(56) References Cited

U.S. PATENT DOCUMENTS

| | | |
|---|---|---|
| 8,645,597 B2 | 2/2014 | Zhou et al. |
| 8,689,082 B2 | 4/2014 | Oh et al. |
| 9,257,185 B2 | 2/2016 | Park et al. |
| 2012/0213005 A1 | 8/2012 | Lee |
| 2013/0170274 A1* | 7/2013 | Yu .................. G11C 11/4063 365/51 |
| 2015/0178192 A1 | 6/2015 | Lee |
| 2015/0242143 A1 | 8/2015 | Kim et al. |
| 2015/0278087 A1 | 10/2015 | Han et al. |
| 2016/0179613 A1* | 6/2016 | Suto .................. G06F 11/1048 714/773 |
| 2016/0260490 A1* | 9/2016 | Lee .................. G11C 16/0466 |

* cited by examiner

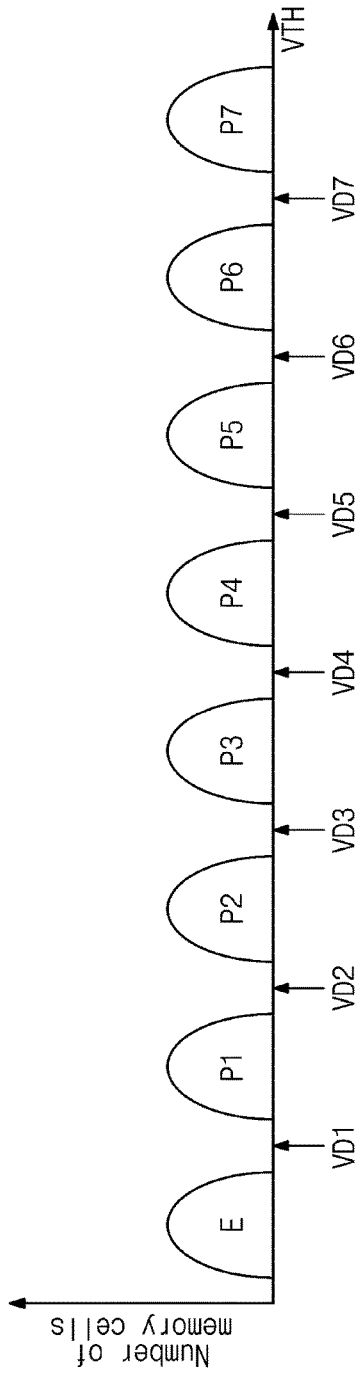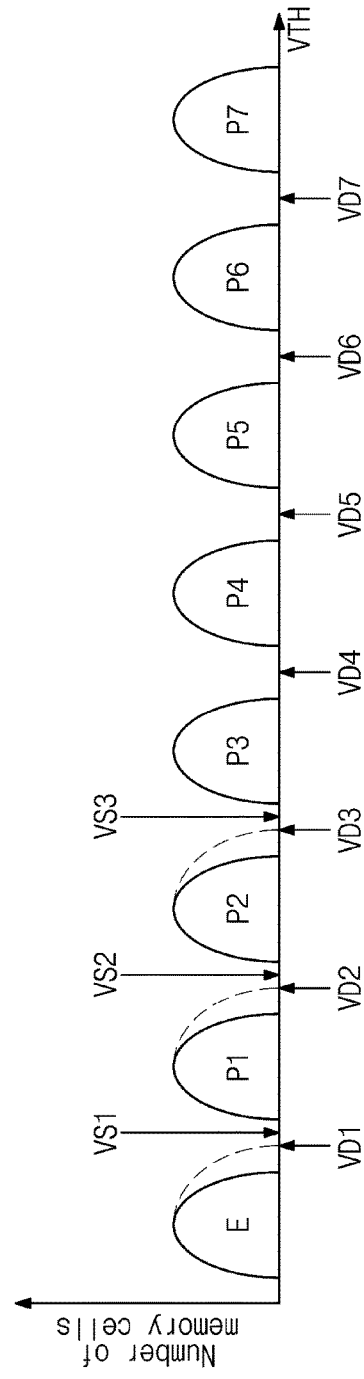

STORAGE DEVICE INCLUDING NONVOLATILE MEMORY DEVICE AND CONTROLLER AND OPERATING METHOD OF THE STORAGE DEVICE

CROSS-REFERENCE TO RELATED APPLICATIONS

A claim for priority under 35 U.S.C. § 119 is made to Korean Patent Application No. 10-2016-0045672, filed on Apr. 14, 2016, the disclosure of which is incorporated herein in its entirety by reference.

BACKGROUND

The inventive concept herein relates generally to semiconductor devices and, more particularly, to storage devices including a nonvolatile memory device and a controller, and operating methods of the storage devices.

Storage devices used as memory typically store data according to control of a host device such as for example a computer, a smartphone, or a smart pad. Storage devices may store data on a magnetic disk such as a hard disk drive (HDD), or may store data in a semiconductor memory (e.g., nonvolatile memory such as a solid state drive (SSD) or a memory card).

Nonvolatile memory devices include for example read-only memory (ROM), programmable ROM (PROM), electrically programmable ROM (EPROM), electrically erasable programmable ROM (EEPROM), flash memory, phase-change RAM (PRAM), magnetic RAM (MRAM), resistive RAM (RRAM), ferroelectric RAM (FRAM), or the like.

As semiconductor manufacturing technology continues to advance, there has been a trend toward highly integrated and high capacity storage devices. With this increased integration, manufacturing costs associated with storage devices have decreased. On the other hand, the increased integration has resulted in reduced storage device scale and structural changes that have consequently led to various problems that may damage and/or degrade the reliability of stored data.

SUMMARY

Embodiments of the inventive concept provide a storage device with improved reliability and an operating method of the storage device.

Embodiments of the inventive concept provide a storage device including a nonvolatile memory device; and a controller configured to generate a read command according to a request of an external host device and to transmit the read command to the nonvolatile memory device. The nonvolatile memory device is configured to perform a read operation in response to the read command to obtain read data, to output the read data to the controller, and to store information about the read operation in an internal register of the nonvolatile memory device.

Embodiments of the inventive concept further provide an operating method of a storage device including a nonvolatile memory device and a controller. The operating method includes receiving a read command from the controller at the nonvolatile memory device; performing a read operation by the nonvolatile memory device in response to the read command; outputting data read during the read operation from the nonvolatile memory device to the controller; storing information about the read operation in the nonvolatile memory device; receiving a get feature command from the controller at the nonvolatile memory device; and outputting the stored information about the read operation to the controller from the nonvolatile memory device in response to the get feature command. The information about the read operation includes information indicating whether the nonvolatile memory device has performed on-chip management to improve accuracy of the read data during the read operation.

Embodiments of the inventive concept still further provide a nonvolatile memory device including a memory cell array configured to store data; a counter configured to count a number of target memory cells of the memory cell array that are in an on-state or a number of the target memory cells of the memory cell array that are in an off-state; and a control logic circuit configured to perform a read operation to obtain read data from the target memory cells responsive to an externally provided command selectively with and without on-chip management based on the counted number of target memory cells, to output the read data to an outside of the nonvolatile memory device, and to store information about the read operation in a register of the control logic circuit.

BRIEF DESCRIPTION OF THE DRAWINGS

The forgoing and other features of the inventive concept will be described below in more detail with reference to the accompanying drawings, in which like reference characters refer to like parts throughout the different views.

FIG. 5 illustrates an example where a read operation is performed without on-chip management;

FIG. 6 illustrates an example where a read operation is performed with on-chip management;

DETAILED DESCRIPTION

As is traditional in the field of the inventive concept, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concept.

Figure 1:
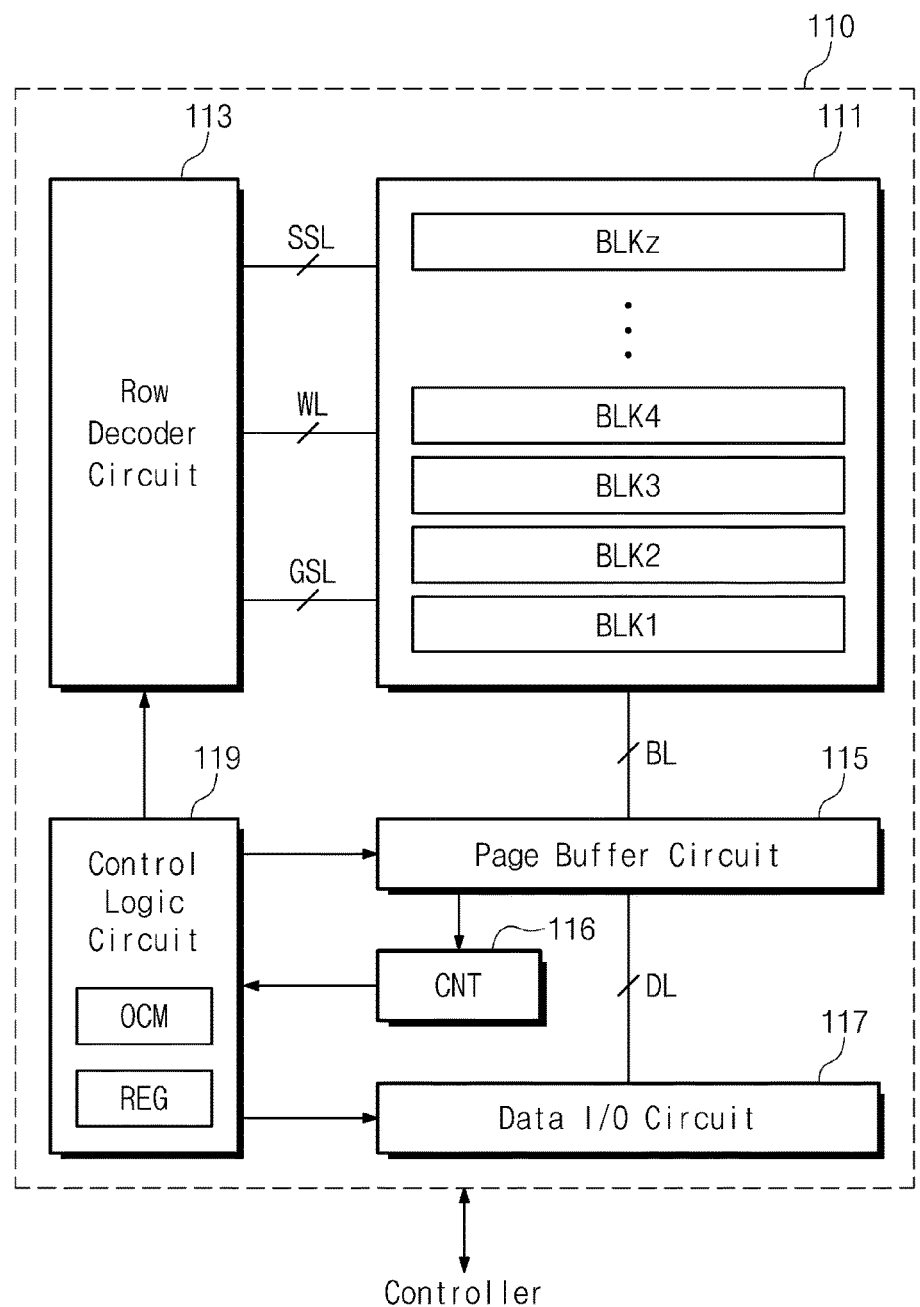
FIG. 1 illustrates a block diagram of a nonvolatile memory device according to embodiments of inventive concept.

FIG. 1 illustrates a block diagram of a nonvolatile memory device 110 according to embodiments of inventive concept. As illustrated, the nonvolatile memory device 110 includes a memory cell array 111, a row decoder circuit 113, a page buffer circuit 115, a counter (CNT) 116, a data input/output (I/O) circuit 117, and a control logic circuit 119.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 113 via at least one ground selection line GSL, a plurality of wordlines WL, and at least one string selection line SSL. Each of the memory blocks BLK1 to BLKz may be connected to the page buffer circuit 115 via a plurality of bitlines BL. The memory blocks BLK1 to BLKz may be commonly connected to the bitlines BL. Memory cells of the memory blocks BLK1 to BLKz have the same structure.

In embodiments of the inventive concept, each of the memory blocks BLK1 to BLKz may be a unit of an erase operation. That is, memory cells of the memory cell array 111 may be erased by units of a single memory block. Memory cells belonging to a single memory block may be erased at the same time. In some embodiments, each of the memory blocks BLK1 to BLKz may be divided into a plurality of sub-blocks. Each of the sub-blocks may be a unit of an erase operation.

In embodiments of the inventive concept, each of the memory blocks BLK1 to BLKz may include a physical storage space identified by a block address. Each of the wordlines WL may correspond to a physical storage space identified by a row address. Each of the bitlines BL may correspond to a physical storage space identified by a column address.

In embodiments of the inventive concept, each of the memory blocks BLK1 to BLKz may include a plurality of physical pages. Each of the physical pages may include a plurality of memory cells. Each of the physical pages may be a unit of a program operation. Memory cells of each of the physical pages may be programmed at the same time. Each of the physical pages may include a plurality of logical pages. Bits respectively programmed into memory cells of each of the physical pages may form logical pages, respectively. First bits programmed into memory cells of each of the physical pages may form a first logical page. $K^{th}$ bits (K being a positive integer) programmed into memory pages of each of the physical pages may form a $K^{th}$ logical page.

The row decoder circuit 113 is connected to the memory cell array 111 via a plurality of ground selection lines GSL, a plurality of wordlines WL, and a plurality of string selection lines SSL. The row decoder circuit 113 operates according to the control of the control logic circuit 119. The row decoder circuit 113 may decode an address received from a controller (such as controller 120 in FIG. 10 for example) through an input/output channel and may control voltages applied to the string selection lines SSL, the wordlines WL, and the ground selection lines GSL according to the decoded address.

For example, during a program operation, the row decoder circuit 113 may apply a program voltage to a selected wordline of a memory block selected by an address and may apply a pass voltage to unselected wordlines of the selected memory block. During a read operation, the row decoder circuit 113 may apply a select read voltage to a selected wordline of a memory block selected by an address and may apply an unselect read voltage to unselected wordlines of the selected memory block. During an erase operation, the row decoder circuit 113 may apply erase voltages (e.g., a ground voltage or low voltages having similar levels to the ground voltage) to wordlines of a memory block selected by an address.

The page buffer circuit 115 is connected to the memory cell array 111 via a plurality of bitlines BL. The page buffer circuit 115 is connected to the data I/O circuit 117 via a plurality of data lines DL. The page buffer circuit 115 operates according to the control of the control logic circuit 119.

During a program operation, the page buffer circuit 115 may store data to be programmed into memory cells. Based on the stored data, the page buffer circuit 115 may apply voltages to the bitlines BL. For example, the page buffer circuit 115 may function as a write driver. During a read operation or a verify read, the page buffer circuit 115 may sense voltages of the bitlines BL and store a sensing result. For example, the page buffer circuit 115 may function as a sense amplifier.

The counter CNT 116 may receive the sensing result from the page buffer circuit 115. Based on the received sensing result, the counter CNT may count the number of off-cells having a value of '1' (i.e., cells in an off-state) or may count the number of on-cells having a value of '0' (i.e., cells in an on-state). A count value of the counter CNT 116 may be transmitted to the control logic circuit 119.

The data I/O circuit 117 is connected to the page buffer circuit 115 via the data lines DL. The data I/O circuit 117 may output data read by the page buffer circuit 115 to a controller via an input/output (I/O) channel and may transmit data received from the controller via the I/O channel to the page buffer circuit 115.

The control logic circuit 119 may receive a command from the controller via the I/O channel and may receive a control signal via a control channel. The control logic circuit 119 may receive the command via the I/O channel in response to a control signal, may route an address received via the I/O channel to the row decoder circuit 113, and may route data received through the I/O channel to the data I/O circuit 117. The control logic circuit 119 may decode the received command and control the nonvolatile memory device 110 according to the decoded command.

In embodiments of the inventive concept, during a read operation, the control logic circuit 119 may generate a data strobe signal DQS from a read enable signal /RE received from the controller via the control channel. The generated data strobe signal DQS may be output to the controller via the control channel. During a program operation, the control logic circuit 119 may receive the data strobe signal DQS from the controller via the control channel.

The control logic circuit 119 includes an on-chip management circuit OCM and a register REG. The on-chip management circuit OCM may determine whether or not to perform on-chip management during a read operation, according to the count result of the counter CNT. When the on-chip management is performed, the on-chip management circuit OCM may control the on-chip management during the read operation. For example, the on-chip management may provide support so that data written into the memory cell array 111 may be read with higher reliability. For example, the on-chip management may provide control including adjusting levels of read voltages during the read operation.

The on-chip management circuit OCM may store information of (about) the read operation, more specifically, information associated with the on-chip management, in the register REG. For example, the on-chip management OCM may store in the register REG information regarding whether the on-chip management is enabled, and information regarding a cause or reason why the on-chip management is enabled.

Figure 2:
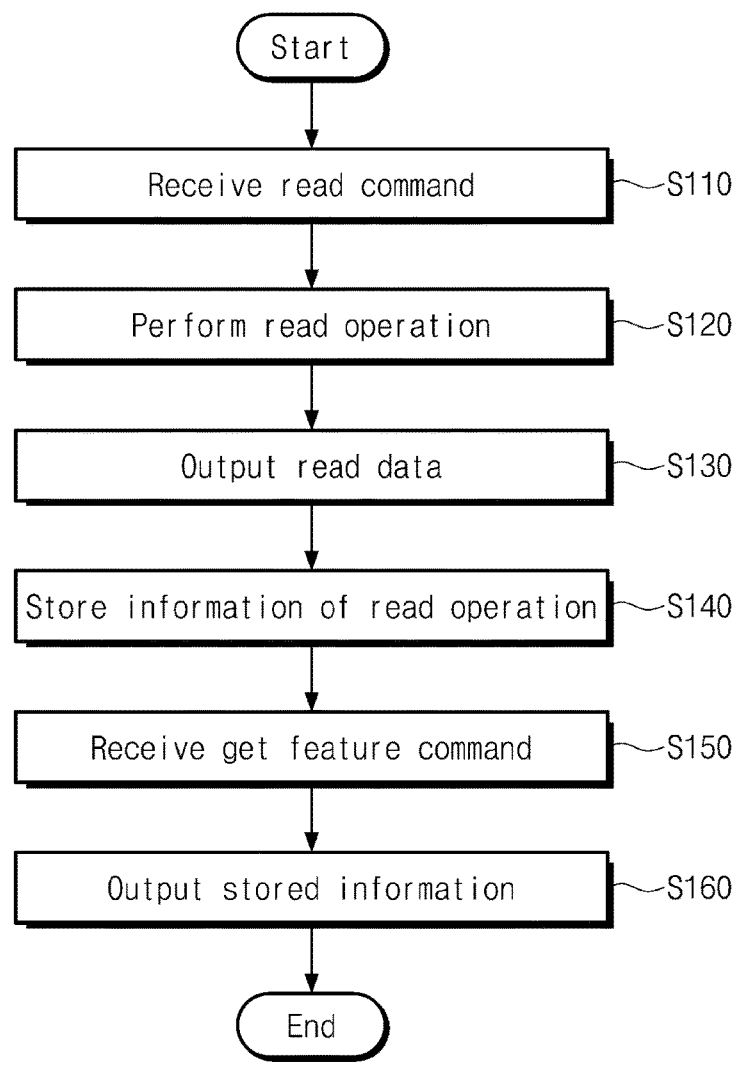
FIG. 2 illustrates a flowchart summarizing an operating method of the nonvolatile memory device in FIG. 1.

FIG. 2 illustrates a flowchart summarizing an operating method of the nonvolatile memory device 110 in FIG. 1. Referring to FIGS. 1 and 2, in operation S110 the nonvolatile memory device 110 may receive a read command from the controller. The read command may be received at the nonvolatile memory device 110 together with indication of a memory block that is a read target and an address to identify memory cells of the read target memory block. The read command may be transmitted to the control logic circuit 119, and the address may be transmitted to the row decoder circuit 113.

In operation S120, the nonvolatile memory device 110 may perform a read operation in response to the read command. For example, the control logic circuit 119 may control the row decoder circuit 113 and the page buffer circuit 115 to perform a read operation on memory cells of a memory block that is a read target. The page buffer circuit 115 may store data sensed via bitlines BL as read data.

In operation S130, the nonvolatile memory device 110 may output the read data. For example, the page buffer 115 may output the read data to the controller via the data I/O circuit 117.

In operation S140, the on-chip management circuit OCM may store information of the read operation in the register REG. For example, the on-chip management circuit OCM may store information in the register REG on whether the on-chip management is enabled during the read operation, a cause of enabling the on-chip management or various information associated with the on-chip management. For example, the on-chip circuit OCM may store (or update) the information of the read operation in the register REG whenever the read operation is performed on the memory cell array 111.

In operation S150, the nonvolatile memory device 110 may receive a get feature command from the controller. The get feature command may be received together with the address to identify the register REG of the control logic circuit 119. For example, the get feature command and the address may be transmitted to the control logic circuit 119.

In operation S160, the nonvolatile memory device 110 may output information of the read operation stored in the register REG. More specifically, the nonvolatile memory device 110 may output information on the on-chip management of the read operation to the controller.

As described with reference to FIGS. 1 and 2, the nonvolatile memory device 110 may perform on-chip management to enhance reliability of data read during a read operation. The nonvolatile memory device 110 may output information on the on-chip management to the controller in response to a get feature command from the controller. Thus, information on whether the on-chip management is performed in the nonvolatile memory device 110, information on a cause of performing the on-chip management, and various information associated with the on-chip management may be obtained from an external entity of the nonvolatile memory device, i.e., the controller. Based on the obtained information on the on-chip management, the controller may perform various operations to enhance reliability of the nonvolatile memory device 110. Thus, reliability of the nonvolatile memory device 110 and the storage device including the nonvolatile memory device 110 may be improved.

In FIGS. 1 and 2, it has been described that the register REG is included in the control logic circuit 119. However, a position of the register REG is not limited. For example, in other embodiments of the inventive concept the register REG may be provided in the page buffer circuit 115, provided in the data I/O circuit 117 or provided as an independent component that is not included in the data I/O circuit 117 and the control logic circuit 119.

In FIGS. 1 and 2, it has been described that the counter CNT is provided as an independent component that is not included in the page buffer circuit 115, the data I/O circuit 117, and the control logic circuit 119. However, a position of the counter CNT is not limited. For example, in other embodiments of the inventive concept the counter CNT may be included in one of the page buffer circuit 115, the data I/O circuit 117, and the control logic circuit 119.

Figure 3:
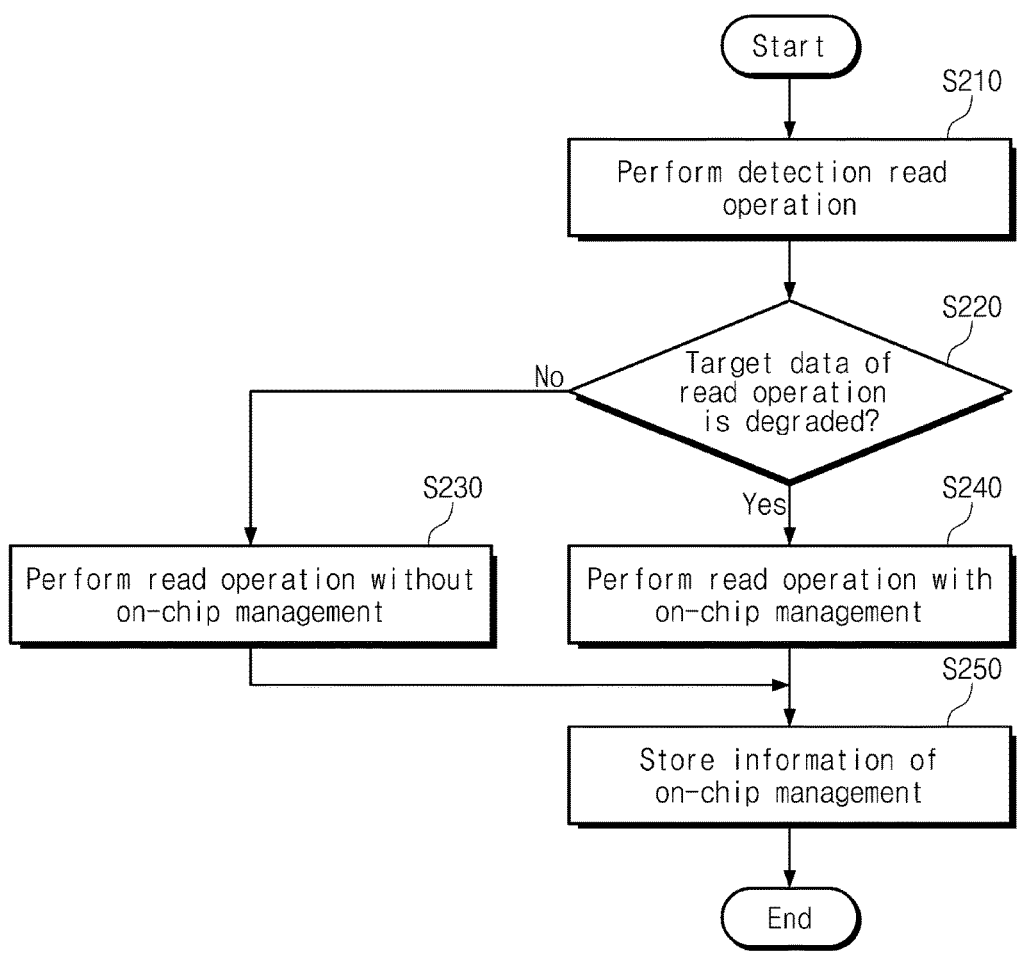
FIG. 3 illustrates a flowchart summarizing a method of performing a read operation by a nonvolatile memory device.

FIG. 3 illustrates a flowchart summarizing a method of performing a read operation (S120 in FIG. 2) by the nonvolatile memory device 110. Referring to FIGS. 1 and 3, in operation S210, the nonvolatile memory device 110 may perform a detection read operation in response to a read command. The detection read operation may be used to detect the degradation degree of data written into memory cells of a memory block that are read targets before the data is read from the memory cells by a read operation in response to the read command. That is, the detection read operation may be performed on memory cells designated as a read target by the read address received together with the read command. The detection read operation may be performed as a pair with the read operation.

Figure 4:
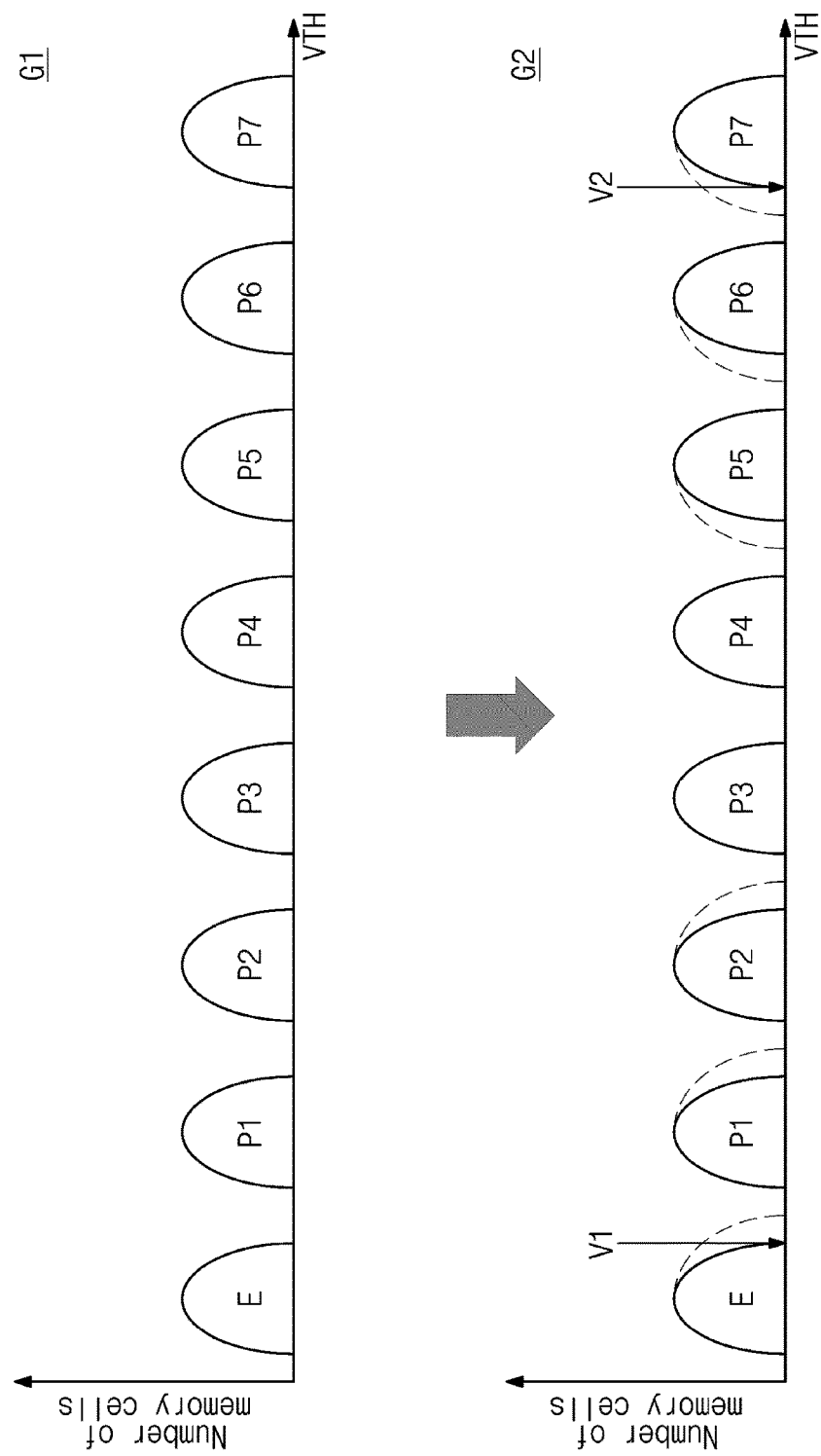
FIG. 4 illustrates an example where data written into memory cells are degraded.

FIG. 4 illustrates an example where data written into memory cells are degraded. Referring to FIGS. 1 and 4, in a first graph G1 and a second graph G2, the horizontal axes denote threshold voltages VTH of memory cells and the vertical axes denote the number of memory cells.

The first graph G1 shows an example where three bits are written into a single memory cell. The three bits written into the single memory cell may have eight different values (or states). That is, the single memory cell into which the three bits are written may have one of the eight different states, and the eight different states may correspond to an erase state E and first to seventh program states P1 to P7, respectively. The first graph G1 indicates a dispersion of threshold voltages VTH of a plurality of memory cells when data is written into the memory cells.

Threshold voltages of the memory cells may change with the lapse of time after the data is written into the memory cells. For example, threshold voltages of memory cells belonging to a low threshold voltage range such as an erase state E and first and second program states P1 and P2 may increase due to disturbance. In the second graph G2, dotted lines indicate increases in threshold voltages of memory cells in the erase state E and the first and second program states P1 and P2. Similarly, threshold voltages of memory cells belonging to a relatively high threshold voltage range such as fifth to seventh program states P5 to P7 may decrease due to retention characteristics. In the second graph G2, dotted lines indicate decreases in threshold voltages of memory cells in the fifth to seventh program states P5 to P7.

In example embodiments, a detection read operation may be performed using a first voltage V1, and the number of on-cells, which are turned on, may be counted using the counter CNT. For example, data written into the nonvolatile memory device 110 may be encoded to have the erase state E and the first to seventh program states P1 to P7 at similar ratios (or substantially the same ratio). Thus, the number of memory cells in the erase state E may belong to the range determined by the encoding. As the threshold voltages of the memory cells in the erase state E increase over the first voltage V1, the number of on-cells decreases. Thus, the control logic circuit 119 or the on-chip management circuit OCM may determine that data belonging to a relatively low threshold voltage range such as the erase state E and the first and second program states P1 and P2 are degraded as the number of on-cells decreases from the range determined by the encoding.

Similarly, the detection read operation may include performing a read operation using a second voltage V2 in a second graph G2, and counting the number of off-cells, which are turned off, using the counter CNT. The control logic circuit 119 or the on-chip management circuit OCM may determine that data belonging to a relatively high threshold voltage range such as the fifth to seventh program states P5 to P7 are degraded as the number of the off-cells decreases.

Returning to FIGS. 1 to 3, in operation S220, the control logic circuit 119 or the on-chip management circuit OCM may determine whether target data that is a target of a read operation is degraded. For example, when the number of on-cells turned on by the first voltage V1 or the number of off-cells turned off by the second voltage V2 is smaller than a predetermined reference value, the control logic circuit 119 or the on-chip management circuit OCM may determine that the target data is degraded.

When the target data is not degraded (No in S220), the flow proceeds to operation S230 in which the nonvolatile memory device 110 may perform a read operation without on-chip management. When the target data is degraded (Yes in S220), the flow proceeds to operation S240 in which the nonvolatile memory device 110 may perform a read operation using the on-chip management.

In operation S250, the on-chip management circuit OCM may store information of the on-chip management in the register REG.

In example embodiments of the inventive concept, the detection read operation S210 and the operations S220 and S230 to determine whether or not to use the on-chip management may be performed when predetermined conditions are satisfied. When the predetermined conditions are not satisfied, operations S210 and S230 may be omitted, and only operations S240 and S250 may be performed. For example, the predetermined conditions may include an erase count of a memory block that is a target of a read operation, the number of times the read operation has been performed after writing data into the memory block that is the target of the read operation, the time elapsed after writing data into memory cells of the memory block that is the target of the read operation, and the like. When the erase count is greater than a reference value, when the number of times the read operation has been performed is greater than a reference value, or when the time elapsed after writing data is greater than a reference value, the predetermined conditions are considered to have been satisfied and operations S210 to 230 may be performed. In contrast, when the erase count is not greater than a reference value, when the number of times the read operation has been performed is not greater than a reference value, or when the time elapsed after writing data is not greater than a reference value, the predetermined conditions are considered to have not been satisfied, and operations S210 to 230 may be omitted so that only operations S240 and S250 may be performed.

In example embodiments, the detection read operation S210 may be performed after the read operations S230 or S240. A read result of the detection read operation S230 may be stored in the register REG (or a separate register) in the control logic circuit 119. During the next read operation, the determination of operation S220 may be performed using the read result stored in the register REG.

In example embodiments, the detection read operation may be performed on memory cells other than the memory cells that are the target of the read operation, e.g., on other memory cells belonging to the memory block that is the target of the read operation.

FIG. 5 illustrates an example where a read operation is performed without on-chip management. In FIG. 5, the horizontal axis denotes threshold voltages VTH of memory cells and the vertical axis denotes the number of the memory cells. Referring to FIGS. 1 and 5, the nonvolatile memory device 110 may perform a read operation using first to seventh default voltages VD1 to VD7 having levels between adjacent two states among the erase state E and the first to seventh program states P1 to P7.

With reference to FIG. 5, when the read operation is performed by disabling the on-chip management, the on-chip management circuit OCM may store in the register REG information indicating that the on-chip management is not performed.

FIG. 6 illustrates an example where a read operation is performed with on-chip management. In FIG. 6, the horizontal axis denotes threshold voltages VTH of memory cells and the vertical axis denotes the number of the memory cells. Referring to FIGS. 1 and 6, after data in the erase state E and the first to seventh program states P1 to P7 are written into the memory cells, data may be written into other adjacent memory cells. When the data are written into the other adjacent memory cells, threshold voltages of the other adjacent memory cells increase from the erase state E. When the threshold voltages of the other adjacent memory cells increase, coupling may occur in memory cells into which a data write operation is already completed. That is, in the memory cells into which the data write operation is completed, the threshold voltages of the memory cells belonging to the relatively low threshold voltage range such as the erase state E and the first and second program states P1 and P2 may increase due to the coupling with the other adjacent memory cells. In FIG. 6, dotted lines indicate threshold voltages that increase due to the coupling.

For example, the greater the increase in threshold voltages of the other adjacent memory cells, the greater the degree of increasing the threshold voltages belonging to the relatively low threshold voltage range such as the erase state E and the first and second program states P1 and P2 due to the coupling. On-chip management according to example embodiments of inventive concept may detect data of memory cells adjacent to memory cells that are a target of a read operation, or more specifically may detect threshold voltage variation of memory cells adjacent to memory cells that are a target of a read operation, and may adjust read voltages of the memory cells that are the target of a read operation considering the detected variation. For example, as shown in FIG. 6, a read operation may be performed using adjusted first to third voltages VS1 to VS3 instead of first to third default voltages VD1 to VD3 corresponding to the relatively low threshold voltage range.

For example, the greater a difference between threshold voltages of memory cells adjacent to memory cells that are a target of a read operation, the greater a difference between the first to third default voltages VD1 to VD3 and the first to third adjusted voltages VS1 to VS3.

Regarding FIG. 6, it has been described that the first to third default voltages VD1 to VD3 are adjusted into adjusted voltages VS1 to VS3. However, adjusted voltages are not limited to the first to third default voltages VD1 to VD3. For example, in other embodiments of the inventive concept a level of at least one of the first to seventh default voltages VD1 to VD7 may be adjusted when the on-chip management is enabled. For example, the level of at least one of the first to seventh default voltages VD1 to VD7 may be adjusted according to a difference between threshold voltages of adjacent memory cells, or a difference between threshold voltages of adjacent memory cells and threshold voltages of memory cells that are a target of a read operation.

With further regard to FIG. 6, it has been described that threshold voltages of the erase state E and the first and second program states P1 and P2 increase due to coupling. However, the effect of the coupling may emerge at any of the erase state E and the first to seventh program states P1 to P7. Although FIG. 6 as shown emphasizes for example that the effect of the coupling emerges in the erase state E and the first and second program states P1 and P2 more intensely than other states, it should be understood that other embodiments of the inventive concept are not limited to intense coupling only at the erase state E and the first and second program states P1 and P2.

Figure 7:
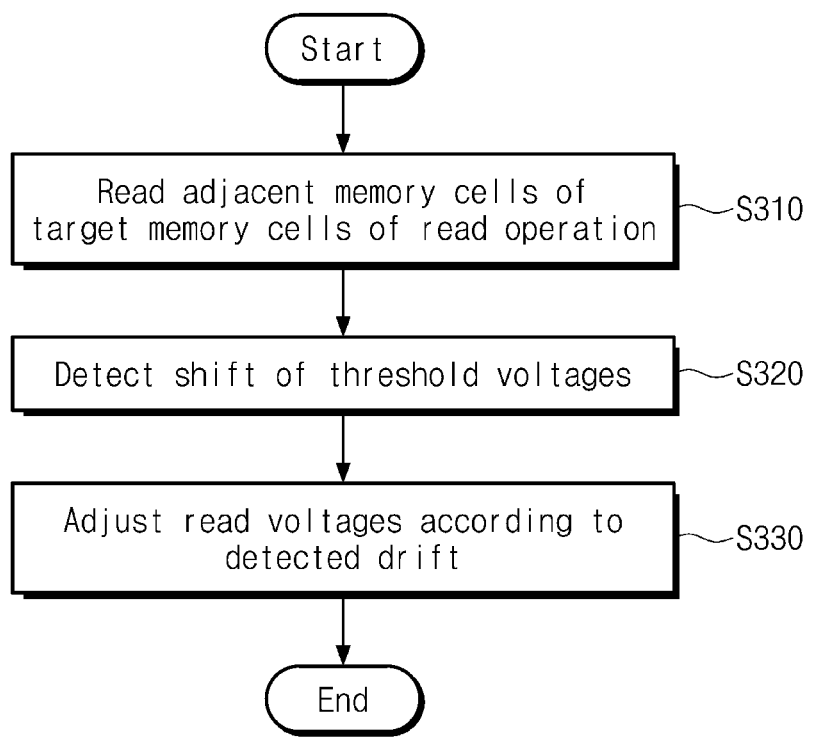
FIG. 7 illustrates a flowchart summarizing a method of performing the on-chip management described with reference to FIG. 6.

FIG. 7 illustrates a flowchart summarizing a method of performing the on-chip management described with reference to FIG. 6. Referring to FIGS. 1 and 7, in operation S310, the nonvolatile memory device 110 may read memory cells adjacent to target memory cells of a read operation according to the control of the on-chip management circuit OCM. For example, the read operation may be performed using all or some of the first to seventh default voltages VD1 to VD7 shown in FIG. 6.

In operation S320, the nonvolatile memory device 110 may detect a shift of threshold voltages according to the control of the on-chip management circuit OCM. For example, the control logic circuit 119 or the on-chip management circuit OCM may detect a shift of threshold voltages of memory cells that are a target of a read operation according to a ratio of data programmed to relatively higher threshold voltages causing relatively more coupling among data written into adjacent memory cells. For example, it may be determined that the higher a ratio of data having relatively high threshold voltages in adjacent memory cells, the greater the number of shifted threshold voltages of memory cells that is a target of a read operation.

As another example, the control logic circuit 119 or the on-chip management circuit OCM may perform a read operation on memory cells that are a target of a read operation. In each memory cell that is the target of the read operation, the control logic circuit 119 or the on-chip management circuit OCM may determine a difference between threshold voltages of adjacent memory cells and a threshold voltage of each memory cell that is the target of the read operation. It may be determined that the greater a difference between threshold voltages, the greater the number of shifted threshold voltages of memory cells that are a target of a read operation.

After detecting the shift amount of threshold voltages in operation S320, in operation S330 the control logic 119 or the on-chip management circuit OCM may thereafter adjust read voltages according to the detected shift amount. For example, instead of the first to third default voltages VD1 to VD3, the first to third adjusted voltages VS1 to VS3 may be respectively selected as read voltages, as described with reference to FIG. 6. After the read voltages are adjusted, a read operation may be performed on the memory cells that are the target of the read operation by using the adjusted read voltages. Read data may therefore be output to a controller by a read operation using the adjusted read voltages.

When a read operation including the on-chip management described with reference to FIGS. 6 and 7 is performed, the on-chip management circuit OCM may write information on on-chip management of a read operation into the register REG. For example, information that indicates that on-chip management is performed, information that indicates an on-cell or off-cell count causing the on-chip management, information of adjusted read voltages, or the like, may be stored in the register REG.

Figure 8:
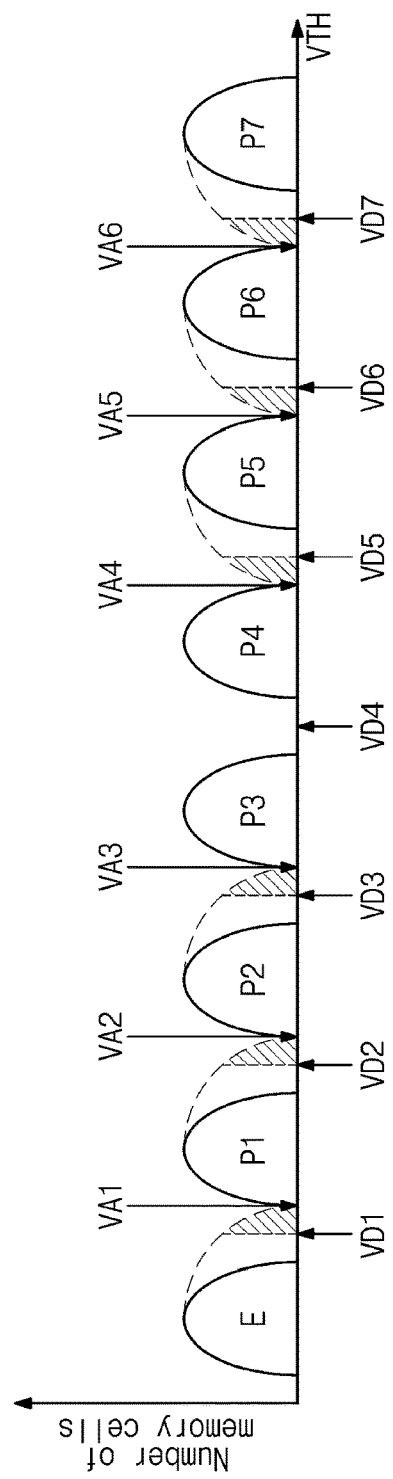
FIG. 8 illustrates another example where a read operation is performed with on-chip management.

FIG. 8 illustrates another example where a read operation is performed with on-chip management. In FIG. 8, the horizontal axis denotes threshold voltages VTH of memory cells and the vertical axis denotes the number of the memory cells. Referring to FIGS. 1 and 8, after data in the erase E and the first and second program states P1 and P2 are written into memory cells, threshold voltages of the memory cells may vary with the lapse of time. For example, threshold voltages of memory cells belonging to a relatively low threshold voltage range such as the erase state E and the first and second program states P1 and P2 may increase as disturbances caused by program and read operations are accumulated. Additionally, threshold voltages of memory cells belonging to a relatively high threshold voltage range such as fifth to seventh program states P5 to P7 may decrease according to retention characteristics. In FIG. 8, dotted lines indicate shifts of threshold voltages with the lapse of time.

When the on-chip management is enabled, the control logic circuit 119 or the on-chip management circuit OCM may control the row decoder circuit 113 and the page buffer circuit 115 such that they perform a dual sensing operation using not only the first to seventh default voltages VD1 to VD7 but also first to sixth additional voltages VA1 to VA6.

Within the relatively low threshold voltage range such as the erase state E and the first and second program states P1 and P2, an additional voltage may be set to be higher than a default voltage. For example, when a read operation between the erase state E and the first program state P1 is performed, a dual sensing operation may be performed using the first default voltage VD1 and the first additional voltage VA1. The counter CNT 116 may count the number of memory cells having threshold voltages between the first default voltage VD1 and the first additional voltage VA1 (portions filled with oblique lines in FIG. 8). As a count value decreases, reliability of a read operation using the first default voltage VD1 is higher than that of a read operation using the first additional voltage VA1. As the count value increases, the reliability of the read operation using the first default voltage VD1 decreases and thus the reliability of the read operation using the first additional voltage VA1 increases. If the count value is smaller than a predetermined reference value, a result of the read operation using the first default voltage VD1 may be selected according to the control of the on-chip management circuit OCM. When the count value is equal to or greater than the predetermined reference value, a result of the read operation using the first additional voltage VA1 may be selected according to the control of the on-chip management circuit OCM.

Within the relatively high threshold voltage range such as the fifth to seventh program states P5 to P7, an additional voltage may be set to be lower than a default voltage. For example, when a read operation between the sixth program state P6 and the seventh program state P7 is performed, a dual sensing operation may be performed using a seventh default voltage VD7 and a sixth additional voltage VA6. The counter CNT may count the number of memory cells having threshold voltages between the seventh default voltage VD7 and the additional voltage VA6 (portions filled with oblique lines in FIG. 8).

As a count value decreases, reliability of a read operation using the seventh default voltage VD7 is higher than that of a read operation using the sixth additional voltage VA6. As the count value increases, the reliability of the read operation using the seventh default voltage VD7 decreases and thus the reliability of the read operation using the sixth additional voltage VA6 increases. If the count value is smaller than a predetermined reference value, a result of the read operation using the seventh default voltage VD7 may be selected according to the control of the on-chip management circuit OCM. When the count value is equal to or greater than the predetermined reference value, a result of the read operation using the sixth additional voltage VA6 may be selected according to the control of the on-chip management circuit OCM.

The results of the read operations selected by the on-chip management circuit OCM may be output to the controller as data read through a read operation after their combination.

With regard to FIG. 8, it has been described that the first to sixth additional voltages corresponding to the first to seventh default voltages VD1 to VD7 are used. However, the number of default voltages and the number of additional voltages are not limited. For example, in some embodiments of the inventive concept, the number of additional voltages may be smaller than or equal to the number of default voltages.

Figure 9:
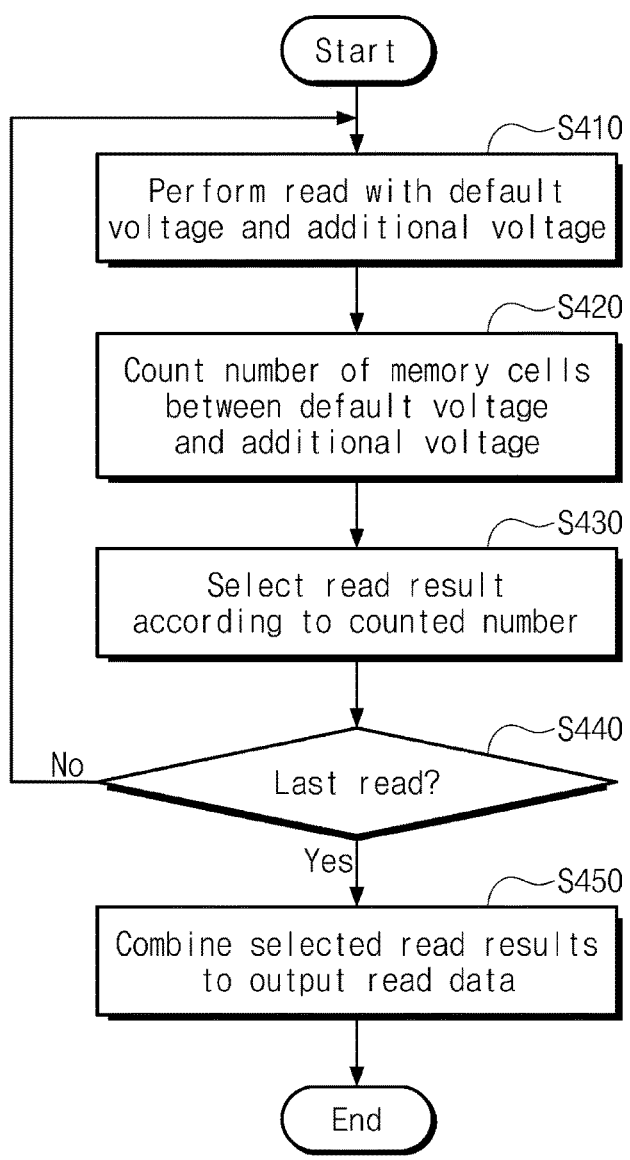
FIG. 9 illustrates a flowchart summarizing a method of performing the on-chip management described with reference to FIG. 8.

FIG. 9 illustrates a flowchart summarizing a method of performing the on-chip management described with reference to FIG. 8. Referring to FIGS. 1, 8, and 9, in operation S410, the nonvolatile memory device 110 may perform a read operation using a default voltage and an additional voltage according to the control of the on-chip management circuit OCM. For example, the nonvolatile memory device 110 may perform a read operation between adjacent states required to perform a read operation designated by a read address among the erase state E and the first to seventh program states P1 to P7.

In operation S420, the counter CNT 116 may count the number of memory cells having a threshold voltage between a default voltage and an additional voltage according to the control of the on-chip management circuit OCM.

In operation S430, the control logic circuit 119 or the on-chip management circuit OCM may select one of a read result using a default voltage and a read result using an additional voltage according to the counted number. For example, the control logic circuit 119 or the on-chip management circuit OCM may compare the counted number of memory cells to a predetermined reference value, and may accordingly select either a result of a read operation using a default voltage or a result of a read operation using an additional voltage, as described above with respect to FIG. 8.

In operation S440, a determination is made as to whether the performed read operation is the last read operation. For example, a determination may be made as to whether read operations required to perform a read operation designated by a read address are all performed. When the performed read operation is not the last read operation, the flow returns to operation S410 in which the next read operation may be performed between other states. When the last read operation is performed, the flow proceeds to operation S450 in which the nonvolatile memory device 110 may output data obtained by combining the selected read operation results as read data according to the control of the on-chip management circuit OCM.

When a read operation including the on-chip management described with reference to FIGS. 8 and 9 is performed, the control logic circuit 119 or the on-chip management circuit OCM may write information on on-chip management of the read operation into the register REG. For example, information on the fact that the on-chip management is performed, an on-cell or off-cell count causing the on-chip management, and information of default voltages and additional voltages corresponding to read data may be stored in the register REG.

Figure 10:
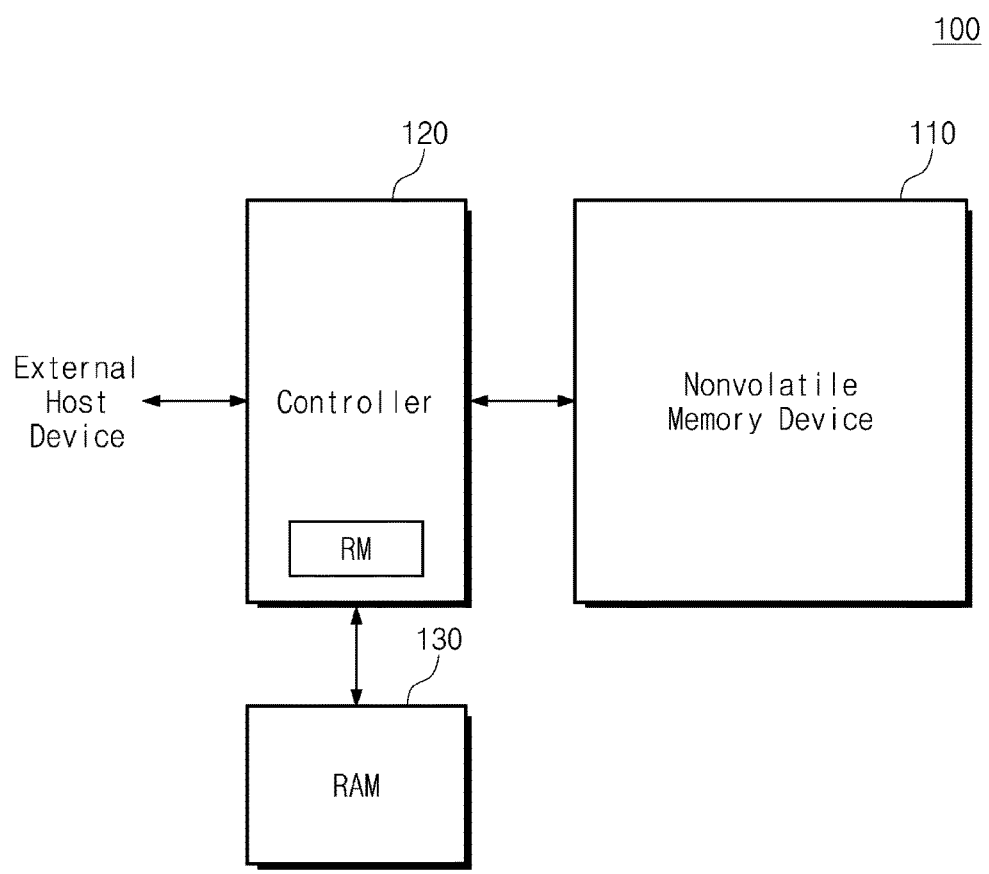
FIG. 10 illustrates a block diagram of a storage device according to embodiments of inventive concept.

FIG. 10 illustrates a block diagram of a storage device 100 according to example embodiments of inventive concept. As illustrated, the storage device 100 includes a nonvolatile memory 110, a controller 120, and a random access memory (RAM) 130.

The nonvolatile memory 110 may perform write, read, and erase operations according to the control of the controller 120. The nonvolatile memory 110 may receive a command and an address from the controller 120 via an input/output (I/O) channel. The nonvolatile memory device 110 may exchange data with the controller 120 via the I/O channel.

The nonvolatile memory 110 may exchange a control signal with the controller 120 via a control channel. For example, the nonvolatile memory 110 may receive, from the controller 120, at least one of a chip select signal /CE to indicate selection of at least one of semiconductor chip, a command latch enable signal CLE to indicate that a signal received from the controller 120 is the command, an address latch enable signal ALE to indicate that a signal received from the controller 120 is the address, a read enable signal /RE generated by the controller 120 during a read operation and periodically toggled to be used to set timings, a write enable signal /WE enabled by the controller 120 when the command or the address is transmitted, a write protection signal /WP enabled by the controller 120 to limit (and/or prevent) an unintentional write or erase operation when power changes, and a data strobe signal DQS generated by the controller 120 during a write operation and periodically toggled to be used to set input synchronization of the data transmitted via the I/O channel. For example, the nonvolatile memory 110 may output, to the controller 120, a ready/busy signal R/nB to indicate that the nonvolatile memory 110 is performing a program, erase or read operation and a data strobe signal DQS generated from the read enable signal /RE by the nonvolatile memory 110 and toggled to be used to set output synchronization of the data.

The nonvolatile memory 110 may for example include flash memory. However, the nonvolatile memory 110 is not limited to inclusion of the flash memory. In some embodiments of the inventive concept, the nonvolatile memory 110 may include at least one of various nonvolatile memory devices such as phase-change RAM (PRAM), magnetic RAM (MRAM), resistive RAM (RRAM), and a ferroelectric RAM (FeRAM).

The storage device 100 may include a nonvolatile memory device described with reference to FIGS. 1 to 9 as the nonvolatile memory device 110. For example, the nonvolatile memory device 110 may include an on-chip management circuit OCM and a register REG, may perform a read operation according to a request of the controller 120, and may output information of a read operation.

The controller 120 is configured to control the nonvolatile memory 110. For example, the controller 120 may control the nonvolatile memory 110 via an I/O channel and a control channel such that the nonvolatile memory device 110 performs a read, write or erase operation.

The controller 120 may control the nonvolatile memory 110 according to the control of an external host device (not shown). For example, the controller 120 may communicate with the external host device according to a format different than a format used for communication with the nonvolatile memory device 110. A data unit used by the controller 120 to communicate with the nonvolatile memory device 110 may be different than a data unit used by the controller 120 to communicate with the external host device.

The controller 120 may use the RAM 130 as a buffer memory, a cache memory or a working memory. The controller 120 may store data or code required to manage the nonvolatile memory 110 in the RAM 130. For example, the controller 120 may read the data or the code required to manage the nonvolatile memory 110 from the nonvolatile memory 110 and load the data or the code to the RAM 130 to drive the nonvolatile memory 110.

The controller 120 may translate a logical address received from the external host device into a physical address of the nonvolatile memory device 110. For example, the external host device may transmit a read request, a write request or an erase request including the logical address to the controller 120. The controller 120 may transmit a read command, a write command or an erase command together with the physical address to the nonvolatile memory device 110. A translation table used by the controller 120 to perform address translation may be stored in the nonvolatile memory device 110 and may be loaded from the nonvolatile memory device 110 to the RAM 130 or a memory in the controller 120.

The controller 120 may further transmit a status read command to determine an operation state of the nonvolatile memory device 110 and a get feature command to acquire related information in the nonvolatile memory device 110 to the nonvolatile memory device 110. Together with the read command or the get feature command, an address transmitted to the nonvolatile memory device 110 may identify the type of information that the controller 120 requests.

The controller 120 includes a refresh manager RM. The refresh manager RM is configured to control a refresh operation of the nonvolatile memory device 110. For example, the refresh operation may include an operation to migrate data written into a first storage space (e.g., first memory block) of the nonvolatile memory device 110 to a second storage space (e.g., second memory block). If the refresh operation is performed, data written into the first storage space is rewritten into the second storage space. Thus, degradation of the data is reduced and reliability of the data is restored. In response to the get feature command, the refresh manager RM may adjust the refresh operation using information of a read operation transferred from the nonvolatile memory device 110, or more specifically using information of an on-chip management operation. For example, the refresh manager RM may adjust a condition in which a refresh operation is performed or triggered.

The RAM 130 may include for example at least one of various random access memory devices such as dynamic RAM (DRAM), static RAM (SRAM), synchronous DRAM (SDRAM), phase-change RAM (PRAM), magnetic RAM (MRAM), resistive RAM (RRAM), ferroelectric RAM (FeRAM) or the like.

The nonvolatile memory device 110 may include a plurality of nonvolatile memory chips. In example embodiments, the controller 120 and the nonvolatile memory chips may be connected to each other based on a channel and a way. A single channel may include a single data channel and a single control channel. A single data channel may include eight data lines. A single control channel may include control lines to transmit the above-mentioned chip enable signal /CE, command latch enable signal CLE, address latch enable signal ALE, read enable signal /RE, write enable signal /WE, write protection signal /WP, and read and busy signal R/nB.

Nonvolatile memory chips connected to a single channel may form a way. If n nonvolatile memory chips are connected to a single channel, an n-way may be formed. Nonvolatile memory chips belonging to a single way may share data lines and control lines to transmit the command latch enable signal CLE, the address latch enable signal ALE, the read enable signal /RE, the write enable signal /WE, and the write protection signal /WP. Each of the nonvolatile memory chips belonging to the single way may communicate with the controller 120 via control lines only for use in transmission of the chip enable signal /CE and the read and busy signal R/nB.

The controller 120 may alternately access nonvolatile memory chips of an n-way connected to a single channel. The controller 120 may independently access nonvolatile memory chips connected to different channels. The controller 120 may alternately or simultaneously access nonvolatile memory chips connected to different channels.

In some embodiments of the inventive concept, nonvolatile memory chips may be connected to the controller 120 in the form of wide I/O. For example, nonvolatile memory chips connected to different channels may share a control line for transmitting a single chip enable signal /CE. Nonvolatile memory chips sharing a control line of a single chip enable signal /CE may be accessed at the same time. Since data lines of different channels are used at the same time, wide input/output bandwidth may be achieved.

The storage device 100 may include for example a solid state drive (SSD) or a hard disk drive (HDD). The storage device 100 may include a personal computer memory card international association (PCMCIA) card, a compact flash card (CF), a smart media card (SM or SMC), a memory stick, a multimedia card (MMC, RS-MMC or MMCmicro), an SD card (SD, miniSD, microSD or SDHC), a universal flash storage (UFS) or the like. The storage device 1300 may include for example an embedded memory such as an embedded multimedia card (eMMC), UFS, and a perfect page new (PPN) device.

As shown in FIG. 10, the storage device 100 includes RAM 130 disposed outside the controller 120. However, in some embodiments of the inventive concept the storage device 100 may not include a RAM such as the RAM 130 disposed outside the controller 120. The controller 120 may be configured to use an internal RAM (see FIG. 14) as a buffer memory, a working memory or a cache memory.

Figure 11:
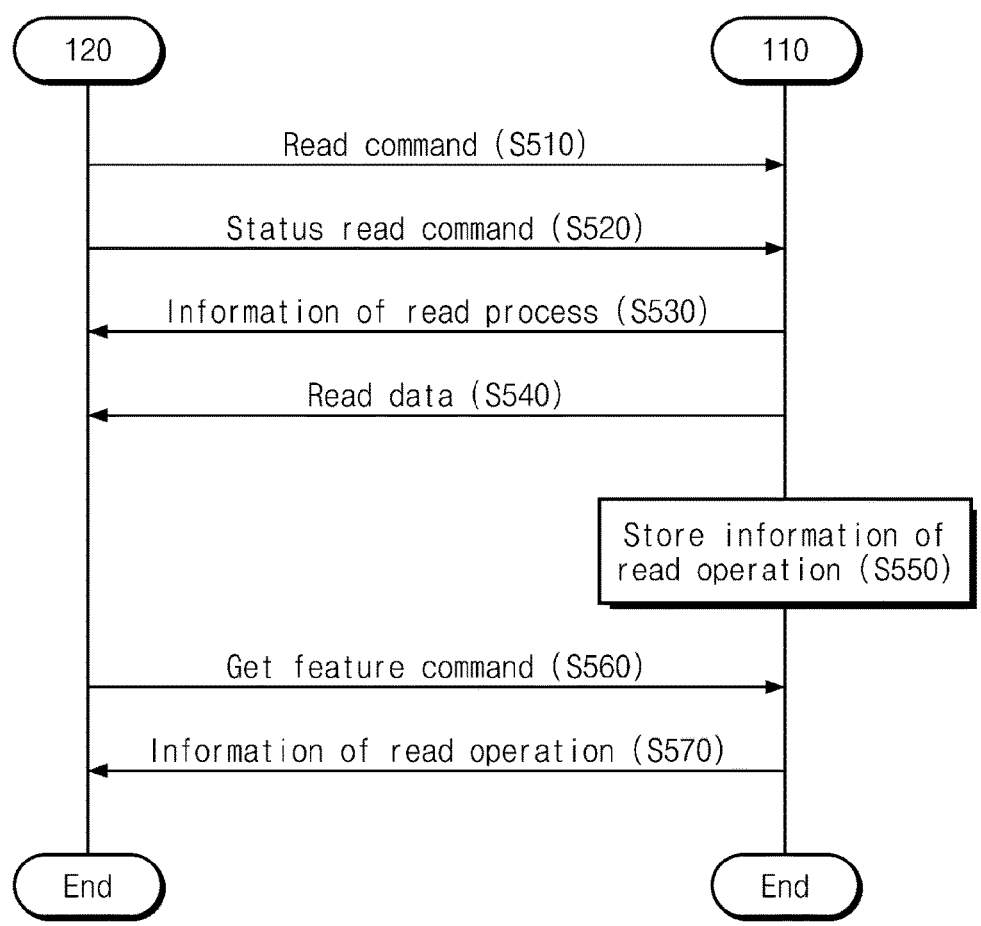
FIG. 11 illustrates a flowchart summarizing a method of performing a read operation in a storage device.

FIG. 11 illustrates a flowchart summarizing a method of performing a read operation in the storage device 100. Referring to FIGS. 1, 10, and 11, in operation S510, the controller 120 may transmit a read command to the nonvolatile memory device 110. The read command may be transmitted to the nonvolatile memory device 110 together with a physical address of the nonvolatile memory device 110 identifying memory cells that are a target of a read operation. In response to the read command and the physical address, the nonvolatile memory device 110 may start performing a read operation.

In operation S520, the controller 120 may transmit a status read command to the nonvolatile memory device 110. The status read command may be used to check, for example, a processing state of the read operation. In operation S530, the nonvolatile memory device 110 may transmit information of the read operation to the controller 120. When the read operation is completed, the flow proceeds to operation S540 in which the nonvolatile memory device 110 may output the read data to the controller 120.

In operation S550, the on-chip management circuit OCM may store information of the read operation in the register REG.

In operation S560, the controller 120 may transmit the get feature command to the nonvolatile memory device 110. The controller 120 may transmit the get feature command to the nonvolatile memory device 110 when requiring information managed in the nonvolatile memory device 110. For example, the controller 120 may transmit the get feature command together with an address identifying the register REG to the nonvolatile memory device 110 when requiring information on a read operation of the nonvolatile memory device 110.

In operation S570, the nonvolatile memory device 110 may transmit the information of the read operation to the controller 120 in response to the get feature command In response to the information of the read operation, the controller 120 may perform various operations to enhance reliability of the nonvolatile memory device 110. For example, according to a result of the read operation, the refresh management RM may adjust a condition in which a refresh operation is performed or triggered.

Figure 12:
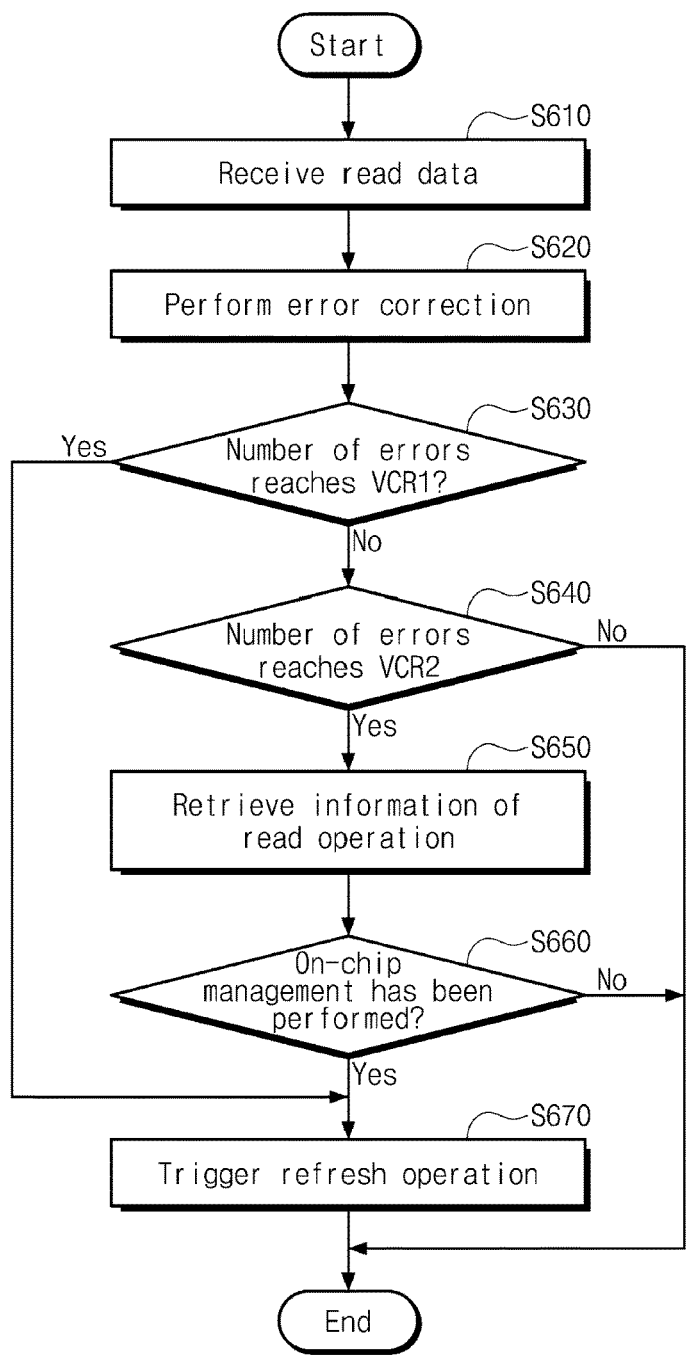
FIG. 12 illustrates a flowchart summarizing a method of operating a controller according to information of a read operation.

FIG. 12 illustrates a flowchart summarizing a method of operating the controller 120 according to information of a read operation. Referring to FIGS. 10 and 12, in operation S610, the controller 120 may receive read data from the nonvolatile memory device 110.

In operation S620, the controller 120 may perform error correction on the read data. For example, the controller 120 may perform the error correction based on at least one of various error correction codes such as a low density parity check (LDPC) code, a turbo code, a Bose-Chaudhuri-Hocquenghem (BCH) code, a Reed-Solomon (RS) code, and a polar code.

In operation S630, the controller 120 determines whether the number of errors detected from the read data reaches a first critical value VCR1. For example, the first critical value VCR1 may be decided to be 70 percent of the number of errors that can be corrected by an error correction code used in the controller 120. However, the first critical value VCR1 is not limited to be 70 percent and in other embodiments may be a different percent of the number of errors that can be corrected. When the number of the errors reaches the first critical value VCR1 (Yes in S630), the flow proceeds to operation S670 in which the refresh manager RM may trigger a refresh operation. For example, the refresh operation may be scheduled to be carried out on memory cells or a memory block corresponding to read data.

When the number of the errors is smaller than the first critical value VCR1 (No is S630), the flow proceeds to operation S640 in which the controller 120 determines whether the number of errors reaches a second critical value VCR2. The second critical value VCR2 may be smaller than the first critical value VCR1. For example, the second critical value VCR2 may be decided to be 50 percent of the number of errors that can be corrected by the error correction code used in the controller 120. However, the second critical value VCR2 is not limited to be 50 percent and in other embodiments may be a different percent of the number of errors that can be corrected and that is smaller than the first critical value VCR1.

When the number of the errors is smaller than the second critical value VCR2 (No in S640), the refresh manager RM does not trigger the refresh operation and the process ends. When the number of the errors is smaller than the first critical value VCR1 and greater than or equal to the second critical value VCR2 (Yes in S640), the flow proceeds to operation S650 in which the controller S120 may obtain information of the read operation. For example the controller 120 may transmit the get feature command to the nonvolatile memory device 110 and may obtain the information of the read operation from the nonvolatile memory device 110, or more specifically may obtain the information of on-chip management from the nonvolatile memory device 110. In operation S660, the controller 120 may determine whether the on-chip management has been performed from the information of the read operation. When the on-chip management has not been performed (No in S660), the refresh manager RM does not perform the refresh operation and the process ends. When the on-chip management has been performed, the flow proceeds to operation S670 in which the refresh manager RM may trigger the refresh operation.

As described above, the controller 120 may compare the number of errors of read data with the first critical value VCR1 and the second critical value VCR2. When the number of the errors is greater than or equal to the first critical value VCR1, a refresh operation is performed irrespective of whether on-chip management is performed. When the number of the errors is smaller than the second critical value VCR2, the refresh operation is not performed irrespective of whether the on-chip management is performed. When the number of the errors is smaller than the first critical value VCR1 and greater than or equal to the second critical value VCR2, the refresh operation may be triggered depending on whether the on-chip management has been performed. For example, the on-chip management may be performed as data is degraded. That is, performance of the on-chip management may depend on the degradation of the data. Accordingly, when the number of the errors is smaller than the first critical value VCR1 and greater than or equal to the second critical value VCR2, the refresh operation may be triggered if the on-chip management has been performed and may not be triggered if the on-chip management has not been performed. By linking trigger conditions of the refresh operation with whether or not the on-chip management has been performed, the degradation of data written into the nonvolatile memory device 110 may be controlled more precisely and reliability of the nonvolatile memory 110 and the storage device 100 may be improved.

Figure 13:
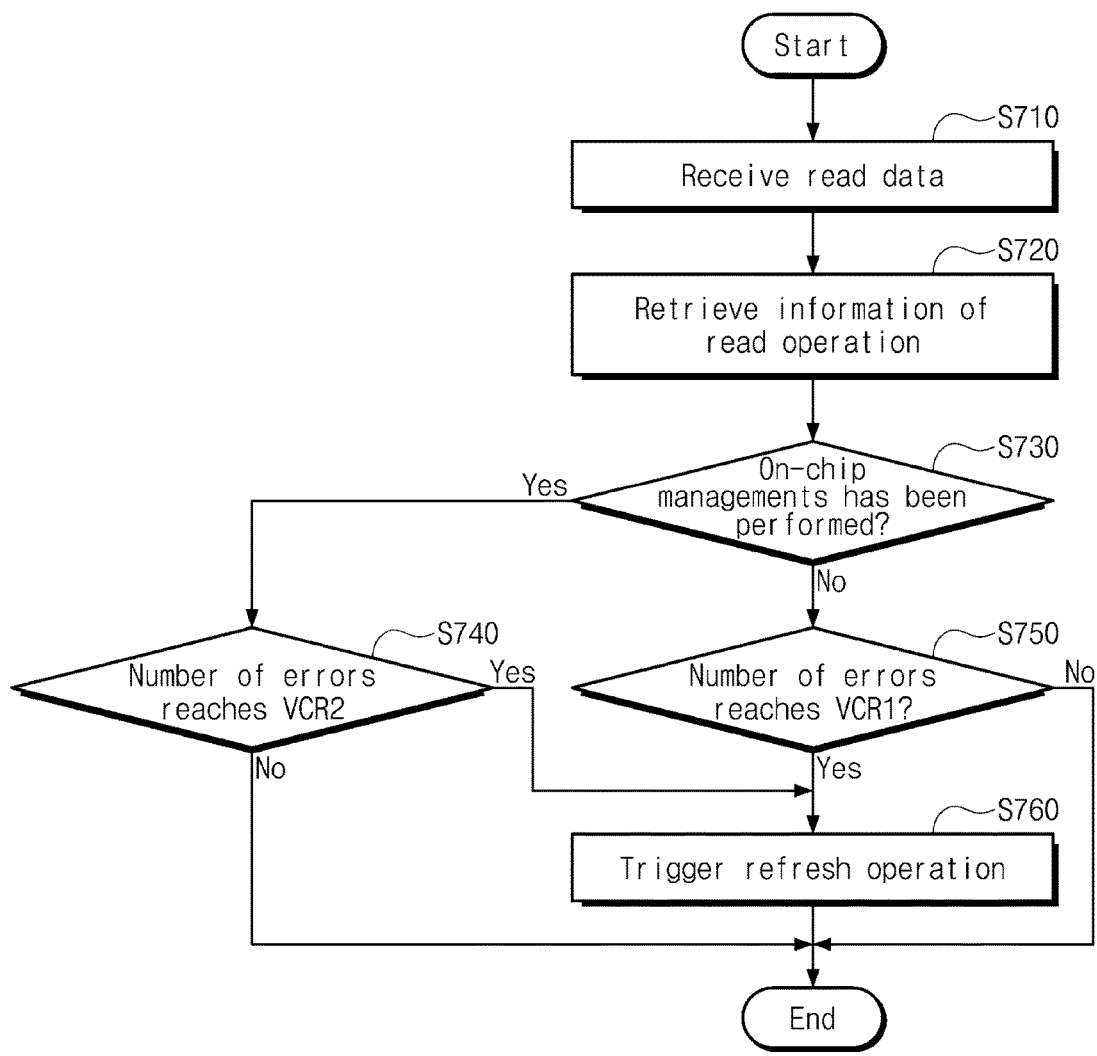
FIG. 13 illustrates a flowchart summarizing another method of operating a controller according to information of a read operation.

FIG. 13 illustrates a flowchart summarizing another method of operating a controller according to information of a read operation. Referring to FIGS. 10 and 13, in operation S710, the controller 120 may receive read data from the nonvolatile memory device 110.

In operation S720, the controller 120 may obtain information of a read operation from the nonvolatile memory device 110, or more specifically may obtain the information of on-chip management from the nonvolatile memory device 110.

In operation S730, the controller 120 may determine whether the on-chip management has been performed from the information of the on-chip management.

When the on-chip management has been performed (Yes in S730), the flow proceeds to operation S740 in which the number of errors of the read data may be compared with a second critical value VCR2. The second critical value VCR2 may be decided to be 50 percent of the number of errors that can be corrected by an error correction code used in the controller 120. However, the second critical value VCR2 is not limited to be 50 percent and in other embodiments may be a different percent of the number of errors that can be corrected. When the number of errors of the read data is smaller than the second critical value VCR2 (No in S740), a refresh operation is not triggered and the process ends. When the number of the errors of the read data reaches the second critical value VCR2 (Yes in S740), the flow proceeds to operation S760 in which the refresh operation is triggered.

When the on-chip management has not been performed (No in S730), the flow proceeds to operation S750 in which the number of the errors of the read data may be compared with a first critical value VCR1. The first critical value VCR1 may be decided to be 70 percent of the number of errors that can be corrected by an error correction code used in the controller 120. However, the first critical value VCR1 is not limited to be 70 percent and in other embodiments may be a different percent of the number of errors that can be corrected. When the number of the errors of the read data is smaller than the first critical value VCR1 (No in S750), the refresh operation is not triggered and the process ends. The second critical value VCR2 may be smaller than the first critical value VCR1. When the number of the errors of the read data reaches the first critical value VCR1 (Yes in S750), the flow proceeds to operation S760 in which the refresh operation is triggered.

As described above, the controller 120 may obtain information of a read operation through a get feature command when the read operation is completed. According to the information of the read operation, the controller 120 may select one of the first and second critical values VCR1 and VCR2 as a condition in which a refresh operation is performed. By linking trigger conditions of the refresh operation with whether the on-chip management has been performed, the degradation of data written into the nonvolatile memory device 110 may be controlled more precisely and reliability of the nonvolatile memory 110 and the storage device 100 may be improved.

Figure 14:
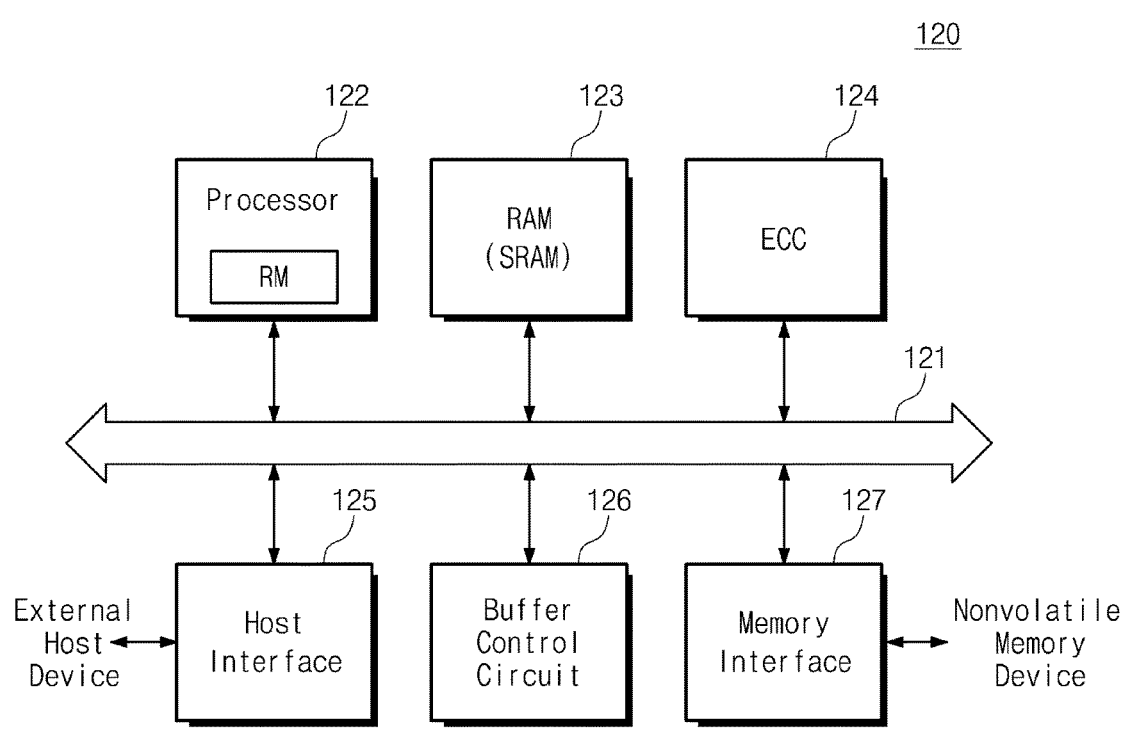
FIG. 14 illustrates a block diagram of a controller according to embodiment of inventive concept.

FIG. 14 illustrates a block diagram of a controller 120 according to an embodiment of inventive concept. Referring to FIGS. 10 and 14, the controller 120 includes a bus 121, a processor 122, a RAM 123, an error correction code (ECC) block 124, a host interface 125, a buffer control circuit 126, and a memory interface 127.

The bus 121 is configured to provide a channel between components.

The processor 122 may control the overall operation of the controller 120 and perform a logical operation. The processor 122 may communicate with an external host device via the host interface 125, communicate with the nonvolatile memory device 110 via the memory interface 127, and communicate with the RAM 130 via the buffer control circuit 126. The processor 122 may control the storage device 100 by using the RAM 123 as a working memory, a cache memory or a buffer memory.

The RAM 123 may be used as a working memory, a cache memory or a buffer memory of the processor 122. The RAM 123 may store codes and commands that the processor 122 executes. The RAM 123 may store data that the processor 122 processes. The RAM 123 may include a static RAM (SRAM).

The ECC 124 may perform error correction. The ECC 124 may perform error correction encoding based on data to be written into the nonvolatile memory device 110 via the memory interface 127. Error-correction-encoded data may be transmitted to the nonvolatile memory 110 via the memory interface 127. The ECC 124 may perform error correction encoding on data received from the nonvolatile memory device 110 via the memory interface 127. In some embodiments, the ECC 124 may be included in the memory interface 127 as an element of the memory interface 127.

The host interface 125 is configured to communicate with an external host device according to the control of the processor 122. The host interface 125 may be configured to perform communication based on at least one of various communication protocols such as fore example Universal Serial Bus (USB), Serial AT Attachment (SATA), Small Computer System Interface (SCSI), Serial Attached SCSI (SAS), High Speed Interchip (HSIC), Firewire, Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), Load Reduced DIMM (LRDIMM) or the like.

The buffer control circuit 126 is configured to control the RAM 130 according to the control of the processor 122.

The memory interface 127 is configured to communicate with the nonvolatile memory 110 according to the control of the processor 122. As described with reference to FIG. 1, the memory interface 127 may exchange a command, an address, and data with the nonvolatile memory device 110 via an input/output (I/O) channel. The memory interface 127 may exchange a control signal with the nonvolatile memory device 110 via a control channel.

In embodiments of the inventive concept, the buffer control circuit 126 may be excluded from controller 120 when the storage device 100 is not provided with the RAM 130.

In embodiments of the inventive concept, the processor 122 may control the controller 120 using codes. The processor 122 may load codes from a nonvolatile memory (e.g., ROM) provided in the controller 120. In some embodiments, the processor 122 may load codes received from the memory interface 127.

In embodiments of the inventive concept, the bus 121 of the controller 120 may be classified into a control bus and a data bus. The data bus may be configured to transmit data in the controller 120, and the control bus may be configured to transmit control information such as a command and an address in the controller 120. The data bus and the control bus may be separated from each other and may not interfere with each other or may not have an influence on each other. The data bus may be connected to the host interface 125, the buffer control circuit 126, the ECC 124, and the memory interface 127. The control bus may be connected to the host interface 125, the processor 122, the buffer control circuit 126, the RAM 123, and the memory interface 127.

In embodiments of the inventive concept, a refresh manager RM may be implemented with firmware or software driven by a hardware circuit in the processor 122. However, the location of the refresh manager RM is not limited to inside the processor 122 and in other embodiments may be disposed elsewhere.

Figure 15:
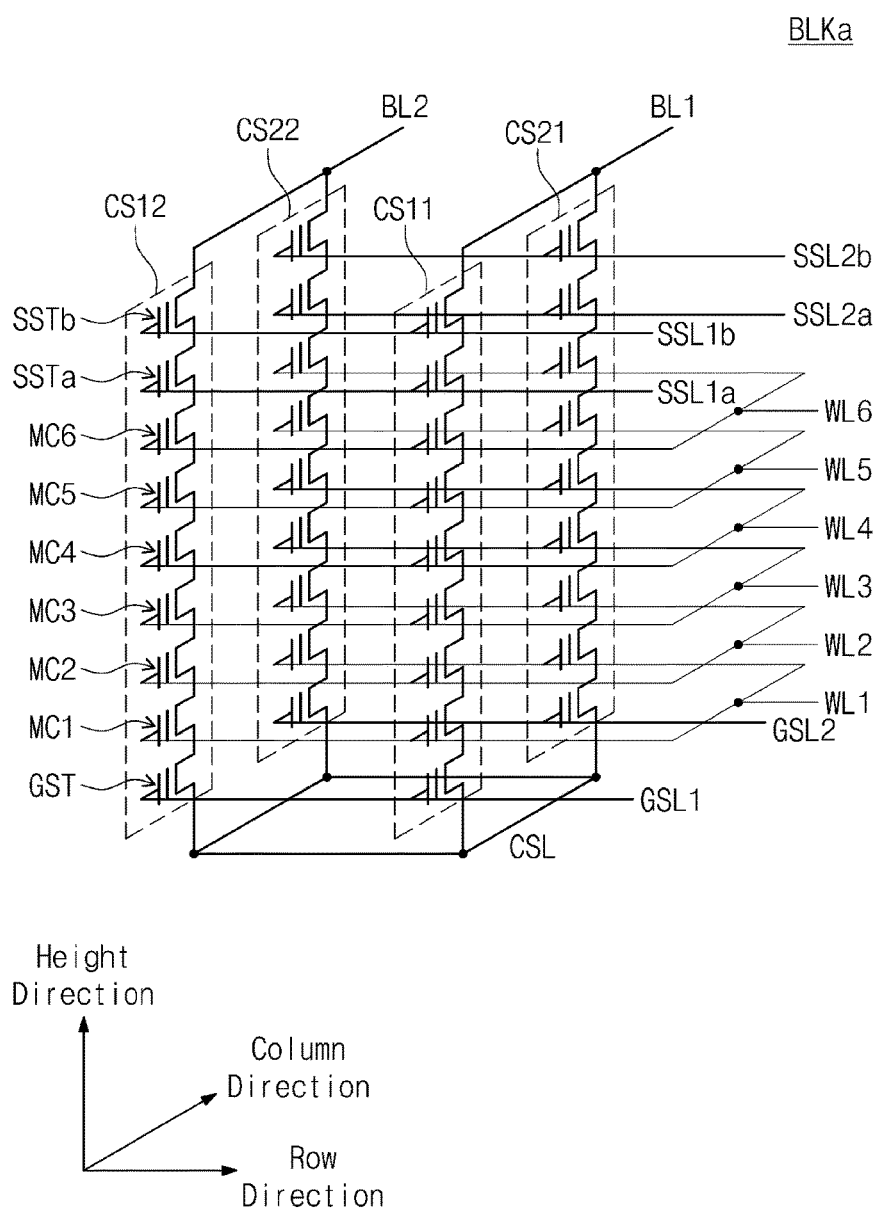
FIG. 15 illustrates a circuit diagram of a memory block according to embodiments of inventive concept.

FIG. 15 illustrates a circuit diagram of a memory block BLKa according to embodiments of inventive concept. As illustrated, the memory block BLKa includes a plurality of cell strings CS11, CS21, CS12, and CS22. The cell strings CS11, CS21, CS12, and CS22 may be arranged in a row direction and a column direction to form rows and columns.

For example, the cell strings CS11 and CS12 arranged in the row direction may form a first row, and the cell strings CS21 and CS22 arranged in the row direction may form a second row. The cell strings CS11 and CS21 arranged in the column direction may form a first column, and the cell strings CS12 and CS22 arranged in the column direction may form a second column.

Each cell string may include a plurality of cell transistors. The cell transistors include ground selection transistors GST, memory cells MC1 to MC6, and string selection transistors SSTa and SSTb. The ground selection transistors GST, the memory cells MC1 to MC6, and the string selection transistors SSTa and SSTb of each cell string may be stacked in a height direction perpendicular to a plane on which the cell strings CS11, CS21, CS12, and CS22 are arranged in a matrix of rows and columns (e.g., a plane on a substrate of the memory block BLKa).

The plurality of cell transistors may be charge trap type transistors having threshold voltages that vary depending on the amount of charged trapped in an insulating layer.

Lowermost ground selection transistors GST may be commonly connected to the common source line CSL.

Control gates of the ground selection transistors GST of the cell strings CS11 and CS12 of the first row may be commonly connected to the ground selection line GSL1, and control gates of the ground selection transistors GST of the cell strings CS21 and CS22 of the second row may be commonly connected to the ground selection line GSL2. That is, cell strings of different rows are connected to different ground selection lines.

In embodiments of the inventive concept, the memory block BLKa may be changed such that ground selection transistors of different heights of the same row are connected to different ground selection lines. In some embodiments, the memory block BLKa may be changed such that ground selection lines connected to ground selection transistors of the same height of different rows are connected to each other to be commonly controlled. In some embodiments, the memory block BLKa may be changed such that ground selection lines connected to ground selection transistors are connected to each other to be commonly controlled.

Control gates of memory cells disposed at the same height (or order) from a substrate (or ground selection transistors GST) may be commonly connected to a single wordline, and control gates of memory cells disposed at different heights (or orders) from the substrate (or ground selection transistors GST) may be connected to different wordlines WL1 to WL6, respectively. For example, memory cells MC1 may be commonly connected to the wordline WL1. Memory cells MC2 may be commonly connected to the wordline WL2. Memory cells MC3 may be commonly connected to the wordline WL3. Memory cells MC4 may be commonly connected to the wordline WL4. Memory cells MC5 may be commonly connected to the wordline WL5. Memory cells MC6 are commonly connected to the wordline WL6.

Of first string selection transistor SSTa of the same height (or order) of the cell strings CS11, CS21, CS12, and CS22, control gates of first string selection transistors SSTa of different rows are connected to different string selection lines SSL1a to SSL2a, respectively. For example, first string selection transistors SSTa of the cell strings CS11 and CS12 may be commonly connected to a string selection line SSL1a. First string selection transistors SSTa of the cell strings CS21 and CS22 may be commonly connected to a string selection line SSL2a.

Of second string selection transistor SSTb of the same height (or order) of the cell strings CS11 to CS21 and CS12 to CS22, control gates of second string selection transistors SSTb of different rows are connected to different string selection lines SSL1b to SSL2b, respectively. For example, second string selection transistors SSTb of the cell strings CS11 and CS12 may be commonly connected to a string selection line SSL1b. Second string selection transistors SSTb of the cell strings CS21 and CS22 may be commonly connected to a string selection line SSL2b.

That is, cell strings of different rows are connected to different string selection lines. String selection transistors of the same height (or order) of the same row are connected to the same string selection line. String selection transistors of different heights (or orders) of the same row are connected to different string selection lines.

In some embodiments of the inventive concept, string selection transistors of cell strings of the same row may be connected to a single string selection line. For example, string selection transistors SSTa and SSTb of a first row may be commonly connected to a single string selection line. String selection transistors SSTa and SSTb of cell strings CS21 and CS22 of a second row may be commonly connected to a single string selection line.

Columns of a plurality of cell strings CS11 to CS21 and CS12 to CS22 are connected to different bitlines BL1 and BL2, respectively. For example, string selection transistors SSTb of cell strings CS11 to CS21 of a first column are commonly connected to a bitline BL1. String selection transistors SSTb of cell strings CS12 to CS22 of a second column are commonly connected to a bitline BL2.

The memory block BLKa is characterized that memory cells disposed at the same height from the substrate share a wordline. Different memory blocks are characterized that wordlines are not shared. For example, a memory cell of a first height of a first memory block may share a wordline with different memory cells of the first height of the first memory block. A memory cell of the first height of the first memory block may not share a wordline with a memory cell of the first height of the second memory block. A sub-block may be characterized as a portion of the memory block BLKa.

The cell strings CS11 and CS12 may form a first plane. The cell strings CS21 and CS22 may form a second plane.

In the memory block BLKa, memory cells of each height of each plane may form a physical page. A physical page may be a unit of write and read operations of the memory cells MC1 to MC6. For example, a single plane of the memory block BLKa may be selected by the string selection lines SSL1a, SSL1b, SSL2a, and SSL2b. When the string selection lines SSL1a and SSL1b are supplied with a turn-on voltage and the string selection lines SSL2a and SSL2b are supplied with a turn-off voltage, cell strings CS11 and CS12 of the first plane are connected to the bitlines BL1 and BL2, e.g., the first plane is selected. When the string selection lines SSL2a and SSL2b are supplied with a turn-on voltage and the string selection lines SSL1a and SSL1b are supplied with a turn-off voltage, cell strings CS21 and CS22 of the second plane are connected to the bitlines BL1 and BL2, e.g., the second plane is selected. In a selected row, the second wordline WL2 may be supplied with a select voltage and the other wordlines WL1 and WL3 to WL6 may be supplied with an unselect voltage. That is, a physical page corresponding to the second wordline WL2 of the second plane may be selected by adjusting voltages of the string selection lines SSL1a, SSL1b, SSL2a, and SSL2b and the wordlines WL1 to WL6. In the memory cells MC2 of the selected physical page, a write or read operation may be performed.

Two or more bits may be written into each of the memory cells MC1 to MC6. Bits written into each of memory cells MC1 to MC6 belonging to a single physical page may form logical pages. A first bit written into each of the memory cells MC1 to MC6 belonging to the single physical page forms a first logical page. An $N^{th}$ bit written into each of the memory cells MC1 to MC6 belonging to the single physical page forms an $N^{th}$ logical page. A logical page may be a unit of data access. When a read operation is performed in a single physical page, data may be accessed in units of logical pages.

In the memory block BLKa, an erase operation of the memory cells MC1 to MC6 may be performed in units of memory blocks or sub-blocks. When the erase operation is performed in units of memory blocks, all memory cells MC of the memory block BLKa may be erased at the same time according to a single erase request. When the erase operation is performed in units of sub-blocks, some of the memory cells MC of the memory block BLKa may be erased at the same time according to a single erase request (e.g., an erase request from an external controller) and the others may be erase-inhibited. A wordline connected to erased memory cells may be supplied with a low voltage (e.g., ground voltage or a low voltage having a similar level to the ground voltage), and a wordline connected to erase-inhibited memory cells may be floated.

The memory block BLKa shown in FIG. 15 is merely a non-limiting example. However, embodiments of the inventive concept are not limited to the memory block BLKa shown in FIG. 15. For example, the number of rows of cell strings may increase or decrease. As the number of the rows of the cell strings varies, the number of string selection lines or the number of ground selection lines, and the number of cell strings connected to a single bitline may also vary.

The number of columns of cell strings may increase or decrease. As the number of columns of cell strings varies, the number of bitlines connected to the columns of the cell strings and the number of cell strings connected to a single string selection line may also vary.

The height of cell strings may increase or decrease. For example, the number of ground selection transistors, memory cells or string selection transistors stacked on the respective cell strings may increase or decrease.

In some embodiments of the inventive concept, memory cells MC that are connected to a single wordline and belong to a single row may correspond to at least three pages. For example, k bits (k being an integer greater than or equal to 2) may be programmed into a single memory cell. In memory cells MC that are connected to a single wordline and belong to a single row, k bits programmed into each of the memory cell MC may form k pages.

As described above, a three-dimensional (3D) memory array is provided with the memory block BLKa. The 3D memory array may be monolithically formed in one or more physical levels of arrays of memory cells MC1 to MC6 having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In some embodiments of inventive concept, the 3D memory array includes vertical NAND strings that are vertically oriented such that at least one memory cell is located over another memory cell. The at least one memory cell may comprise a charge trap layer. Each vertical NAND string may include at least one selection transistor located over the memory cells MC1 to MC6, the at least one select transistor having the same structure as the memory cells and being formed monolithically together with the memory cells MC1 to MC6.

The following patent documents, which are hereby incorporated by reference, describe suitable configurations for three-dimensional memory arrays, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Figure 16:
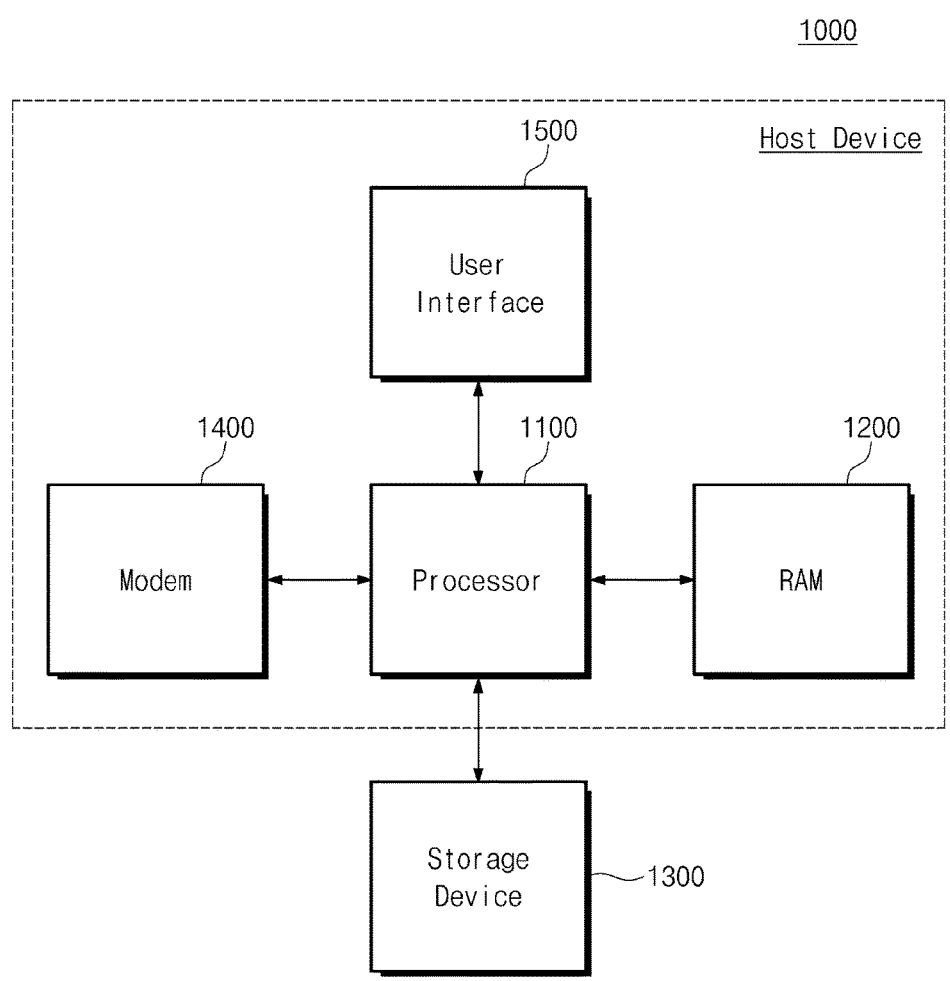
FIG. 16 illustrates a block diagram of a computing device according to embodiments of inventive concept.

FIG. 16 illustrates a block diagram of a computing device 1000 according to embodiments of inventive concept. As illustrated, the computing device 1000 includes a processor 1100, a random access memory (RAM) 1200, a storage device 1300, a modem 1400, and a user interface 1500.

The processor 1100 may control the overall operation of the computing device 1000 and perform logical operations. The processor 1100 may be a hardware-implemented data processing device having circuitry that is physically structured to execute desired operations represented as code and/or instructions included in a program. For example, the processor 1100 may include a system-on-chip (SoC). The processor 1100 may be a general-purpose processor, a specific-purpose processor or an application processor.

The RAM 1200 may communicate with the processor 1100. The RAM 1200 may be a main memory of the processor 1100 or the computing device 1000. The processor 1100 may temporarily store code or data in the RAM 1200. The processor 1100 may execute code and process data using the RAM 1200. The processor 1100 may execute various types of software such as an operating system and an application using the RAM 1200. The processor 1100 may control the overall operation of the computing device 1000 using the RAM 1200. The RAM 1200 may include volatile memory such as for example static RAM (SRAM), dynamic RAM (DRAM), synchronous DRAM (SDRAM), or non-volatile memory such as for example phase-change RAM (PRAM), magnetic RAM (MRAM), resistive RAM (RRAM), and ferroelectric RAM (FRAM).

The storage device 1300 may communicate with the processor 1100. The storage device 1300 may store data for a relatively long time. That is, the processor 1100 may store data to be preserved for a relatively long time in the storage device 1300. The storage device 1300 may store a boot image to drive the computing device 1000. The storage device 1300 may store source codes of various types of software such as an operating system and an application. The storage device 1300 may store data processed as a result of the execution of various types of software such as an operating system and an application.

In some embodiments of the inventive concept, the processor 1100 may load the source codes stored in the storage device 1300 to the RAM 1200 and execute the codes loaded to the RAM 1200 to drive the various types of software such as an operating system and an application. The processor 1100 may load the data stored in the storage device 1300 to the RAM 1200 and process the data loaded to the RAM 1200. The processor 1100 may store data that needs to be preserved for a relatively long time, among the data stored in the RAM 1200, in the storage device 1300.

The storage device 1300 may include nonvolatile memory such as for example flash memory, phase-change RAM (PRAM), magnetic RAM (MRAM), resistive RAM (RRAM), ferroelectric RAM (FRAM) or the like.

The modem 1400 may communicate with an external device according to the control of the processor 1100. For example, the modem 1400 may perform wired or wireless communications with an external device. The modem 1400 may perform communications based on one or more of a plurality of wireless communication techniques or protocols including, for example, Long Term Evolution (LTE), WiMax, Global System for Mobile communication (GSM), Code Division Multiple Access (CDMA), Bluetooth, Near Field Communication (NFC), WiFi, and Radio Frequency Identification (RFID), and/or one or more of a plurality of wired communication techniques or protocols including, for example, Universal Serial Bus (USB), Serial AT Attachment (SATA), Small Computer Small Interface (SCSI), Firewire, Peripheral Component Interconnection (PCI), PCI express (PCIe), NonVolatile Memory express (NVMe), Universal Flash Storage (UFS), Secure Digital (SD), Secure Digital Input Output (SDIO), Universal Asynchronous Receiver Transmitter (UART), Serial Peripheral Interface (SPI), High Speed SPI (HS-SPI), RS232, Inter-integrated Circuit (I2C), High Speed I2C (HS-I2C), Integrated-interchip Sound (I2S), Sony/Philips Digital Interface (S/PDIF), MultiMedia Card (MMC), and embedded MMC (eMMC).

The user interface 1500 may communicate with a user according to the control of the processor 1100. For example, the user interface 1500 may include one or more user input interfaces. Examples of the one or more user input interfaces include a keyboard, a keypad, a button, a touch panel, a touch screen, a touch pad, a touch ball, a camera, a microphone, a gyroscope sensor, and a vibration sensor. The user interface 1500 may include one or more user output interfaces. Examples of the one or more user output interfaces include a liquid crystal display (LCD), an organic light emitting diode (OLED) display, an active matrix OLED (AMOLED), an LED, a speaker, and a monitor.

The processor 1100, the RAM 1200, the modem 1400, and the user interface 1500 may constitute a host device communicating with the storage device 1300. The storage device 1300 may include the storage device 100 described with reference to FIG. 10. That is, the storage device 1300 may manage data using information of a read operation and thus reliability of the storage device 1300 and the computing device 1000 including the storage device 1300 may be improved.

As described above, a nonvolatile memory device according to embodiments of inventive concept may improve reliability of data read during a read operation through on-chip management. In addition, the nonvolatile memory device may output information on the on-chip management to a controller. The controller may adjust conditions for performing a refresh operation using the information on the on-chip management. Since the nonvolatile memory device is managed by further using the information on the on-chip management, reliability of a storage device may be improved.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it should be understood by one of ordinary skill in the art that variations in form and detail may be made therein without departing from the spirit and scope of the inventive concept.

What is claimed is:

1. A storage device comprising:
a nonvolatile memory device; and
a controller that, in response to a request of an external host device, generates a read command and transmits the read command to the nonvolatile memory device, wherein
the nonvolatile memory device, in response to the read command received from the controller, performs a read operation to obtain data, outputs the data to the controller, and stores information about the read operation in an internal register of the nonvolatile memory device.

2. The storage device of claim 1, wherein:
the controller transmits a get command to the nonvolatile memory device, and
the nonvolatile memory device outputs the information about the read operation, which is stored in the internal register, to the controller in response to the get command.

3. The storage device of claim 2, wherein:
the controller performs an error correction on the data, and
the controller performs a refresh operation of the nonvolatile memory device according to the information about the read operation and a number of errors detected during the error correction.

4. The storage device of claim 3, wherein:
the controller performs the refresh operation when the number of errors detected is greater than a first critical value, and
the controller:
obtains the information about the read operation from the nonvolatile memory device when the number of errors detected is smaller than or equal to the first critical value and greater than a second critical value smaller than the first critical value, and
performs the refresh operation when the information about the read operation indicates that an on-chip management operation has been performed by the nonvolatile memory device during the read operation.

5. The storage device of claim 4, wherein:
the controller obtains the information about the read operation from the nonvolatile memory device after receiving the data,
the controller performs the refresh operation when the information about the read operation indicates that an on-chip management operation has not been performed by the nonvolatile memory device during the read operation and the number of errors detected is greater than the first critical value, and
the controller performs the refresh operation when the information about the read operation indicates that the on-chip management operation has been performed by the nonvolatile memory device during the read operation and the number of the errors detected is greater than a second critical value smaller than the first critical value.

6. The storage device of claim 1, wherein the information about the read operation comprises information indicating whether the nonvolatile memory device performs an on-chip management operation which obtains the data by adjusting the read operation according to a degree of degradation of target data stored in memory cells of the nonvolatile memory device that are targets of the read operation.

7. The storage device of claim 6, wherein the on-chip management operation comprises adjusting levels of read voltages applied to the memory cells that are the targets of the read operation according to first data programmed into adjacent memory cells that are adjacent to the memory cells.

8. The storage device of claim 6, wherein the on-chip management operation comprises performing first and second read operations on the memory cells that are the targets of the read operation using different first and second read voltages between two adjacent program states and selecting one of first data read during the first read operation and second data read during the second read operation as the data according to results of the first and second read operations.

9. The storage device of claim 6, wherein:
the read operation comprises a detection read operation to detect the degree of degradation of the target data and a main read operation to obtain the data, and
the nonvolatile memory device is configured to perform the on-chip management operation according to the detected degree of degradation.

10. The storage device of claim 2, wherein:
the controller transmits an address indicating the internal register together with the get command, and
the nonvolatile memory device reads the information about the read operation stored in the internal register using the address.

11. The storage device of claim 1, wherein:
the request of the external host device includes a logical address, and
the controller translates the logical address into a physical address of the nonvolatile memory device and transmits the physical address together with the read command to the nonvolatile memory device.

12. The storage device of claim 1, wherein the nonvolatile memory device includes a plurality of memory cells stacked on a substrate in a direction perpendicular to the substrate and each of the memory cells includes a charge trap layer.

13. The storage device of claim 1, wherein:
the controller transmits a status read command to the nonvolatile memory device while the nonvolatile memory device performs the read operation, and
the nonvolatile memory device transmits information of a processing state of the read operation to the controller in response to the status read command.

14. The storage device of claim 1, further comprising a random access memory that stores the data transmitted from the nonvolatile memory device according to control of the controller.

15. An operating method executed by a storage device including a nonvolatile memory device and a controller, the operating method comprising:
receiving, by the nonvolatile memory device, a read command communicated by the controller;
performing a read operation by the nonvolatile memory device in response to the read command;
outputting data read during the read operation from the nonvolatile memory device to the controller;
storing, in response to the read command, information about the read operation in the nonvolatile memory device;
receiving, by the nonvolatile memory device, a get command communicated by the controller; and
outputting, by the nonvolatile memory device, the stored information about the read operation to the controller in response to the get command, wherein
the information about the read operation comprises information indicating whether the nonvolatile memory device has performed an on-chip management operation to improve accuracy of the data during the read operation.

16. The operating method of claim 15, wherein the on-chip management operation comprises adjusting levels of read voltages applied to target memory cells of the nonvolatile memory device that are targets of the read operation according to first data programmed into memory cells adjacent to the target memory cells.

17. A nonvolatile memory device comprising:
a memory cell array that stores data;
a counter that counts a number of target memory cells of the memory cell array that are in an on-state or a number of the target memory cells of the memory cell array that are in an off-state; and
a control logic circuit that
in response to an externally provided command, performs a read operation to obtain data from the target memory cells selectively with and without an on-chip management operation based on the number of target memory cells,
outputs the data from the nonvolatile memory device, and
stores information about the read operation in a register of the control logic circuit, wherein
the on-chip management operation comprises adjusting levels of read voltages applied to the target memory cells during the read operation according to first data programmed into memory cells of the memory cell array that are adjacent to the target memory cells.

18. The nonvolatile memory device of claim 17, wherein the control logic circuit performs:
error correction on the data, and
a refresh operation of the nonvolatile memory device according to the stored information about the read operation and a number of errors detected during the error correction.

19. The nonvolatile memory device of claim 17, wherein the control logic circuit:
receives an externally provided get command along with an address indicating the register, and reads, in response to the get command, the information about the read operation from the register using the address and outputs the information about the read operation from the nonvolatile memory device.

* * * * *